(12) United States Patent
Lue et al.

(10) Patent No.: US 9,379,129 B1
(45) Date of Patent: Jun. 28, 2016

(54) ASSIST GATE STRUCTURES FOR THREE-DIMENSIONAL (3D) VERTICAL GATE ARRAY MEMORY STRUCTURE

(71) Applicant: MACRONIX INTERNATIONAL CO., LTD., Hsinchu (TW)

(72) Inventors: Hang-Ting Lue, Hsinchu (TW); Wei-Chen Chen, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/685,420

(22) Filed: Apr. 13, 2015

(51) Int. Cl.
*H01L 27/105* (2006.01)
*H01L 27/115* (2006.01)
*H01L 23/528* (2006.01)
*H01L 21/265* (2006.01)

(52) U.S. Cl.
CPC ...... *H01L 27/1157* (2013.01); *H01L 21/26586* (2013.01); *H01L 23/528* (2013.01); *H01L 27/11582* (2013.01)

(58) Field of Classification Search
CPC .................. H01L 27/1052; H01L 27/11582
USPC .................................................. 257/314–324
See application file for complete search history.

(56) References Cited

U.S. PATENT DOCUMENTS

| 5,218,471 | A  | 6/1993  | Swanson et al. |
|-----------|----|---------|----------------|
| 6,034,882 | A  | 3/2000  | Johnson et al. |
| 6,323,117 | B1 | 11/2001 | Noguchi        |
| 6,906,361 | B2 | 6/2005  | Zhang          |
| 6,906,940 | B1 | 6/2005  | Lue            |
| 7,018,783 | B2 | 3/2006  | Iwasaki et al. |
| 7,081,377 | B2 | 7/2006  | Cleeves        |
| 7,129,538 | B2 | 10/2006 | Lee et al.     |
| 7,177,169 | B2 | 2/2007  | Scheuerlein    |
| 7,274,594 | B2 | 9/2007  | Pascucci et al.|

(Continued)

FOREIGN PATENT DOCUMENTS

| EP | 1936681 A1 | 6/2008 |
| EP | 2048709 A2 | 4/2009 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Cuong Q Nguyen
(74) *Attorney, Agent, or Firm* — Haynes Beffel & Wolfeld LLP

(57) ABSTRACT

A 3D array of memory cells with one or more blocks is described. The blocks include a plurality of layers. The layers in the plurality include semiconductor strips which extend from a semiconductor pad. The layers are disposed so that the semiconductor strips in the plurality of layers form a plurality of stacks of semiconductor strips and a stack of semiconductor pads. Also, a plurality of select gate structures are disposed over stacks of semiconductor strips in the plurality of stacks between the semiconductor pad and memory cells on the semiconductor strips. In addition, different ones of the plurality of select gate structures couple the semiconductor strips in different ones of the stacks of semiconductor strips to the semiconductor pads in the plurality of layers. Further, an assist gate structure is disposed over the plurality of stacks between the select gate structures and the stack of semiconductor pads.

9 Claims, 24 Drawing Sheets

(56) References Cited

U.S. PATENT DOCUMENTS

| | | | |
|---|---|---|---|
| 7,315,474 | B2 | 1/2008 | Lue |
| 7,382,647 | B1 | 6/2008 | Gopalakrishnan |
| 7,420,242 | B2 | 9/2008 | Lung |
| 7,696,559 | B2 | 4/2010 | Arai et al. |
| 7,851,849 | B2 | 12/2010 | Kiyotoshi |
| 7,855,457 | B2 | 12/2010 | Mizukami et al. |
| 8,363,476 | B2 | 1/2013 | Lue et al. |
| 8,383,512 | B2 | 2/2013 | Chen et al. |
| 8,467,219 | B2 | 6/2013 | Lue |
| 8,503,213 | B2 | 8/2013 | Chen et al. |
| 8,736,069 | B2 | 5/2014 | Chiu et al. |
| 8,759,899 | B1 | 6/2014 | Lue et al. |
| 2002/0106823 | A1 | 8/2002 | Hwang et al. |
| 2003/0064295 | A1 | 4/2003 | Yasuyuki et al. |
| 2004/0023499 | A1 | 2/2004 | Hellig et al. |
| 2004/0188822 | A1 | 9/2004 | Hara |
| 2005/0280061 | A1 | 12/2005 | Lee |
| 2007/0045708 | A1 | 3/2007 | Lung |
| 2007/0090434 | A1 | 4/2007 | Davies et al. |
| 2007/0140001 | A1 | 6/2007 | Motoi et al. |
| 2007/0231750 | A1 | 10/2007 | Parikh |
| 2007/0252201 | A1 | 11/2007 | Kito et al. |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0175032 | A1 | 7/2008 | Tanaka et al. |
| 2008/0180994 | A1 | 7/2008 | Katsumata et al. |
| 2008/0247230 | A1 | 10/2008 | Lee et al. |
| 2008/0285350 | A1 | 11/2008 | Yeh |
| 2009/0001530 | A1 | 1/2009 | Goto |
| 2009/0032966 | A1 | 2/2009 | Lee et al. |
| 2009/0097321 | A1 | 4/2009 | Kim et al. |
| 2009/0184360 | A1 | 7/2009 | Jin et al. |
| 2009/0310415 | A1 | 12/2009 | Jin et al. |
| 2010/0007001 | A1 | 1/2010 | Wang et al. |
| 2010/0054015 | A1 | 3/2010 | Lee et al. |
| 2010/0109164 | A1 | 5/2010 | Kang et al. |
| 2010/0133645 | A1 | 6/2010 | Dunne |
| 2010/0182041 | A1 | 7/2010 | Feng et al. |
| 2010/0225000 | A1 | 9/2010 | Sugizaki et al. |
| 2010/0270593 | A1 | 10/2010 | Lung et al. |
| 2011/0031630 | A1 | 2/2011 | Hashimoto |
| 2011/0057321 | A1 | 3/2011 | Wang et al. |
| 2011/0116309 | A1 | 5/2011 | Lung |
| 2011/0235408 | A1 | 9/2011 | Minemura et al. |
| 2012/0068241 | A1 | 3/2012 | Sakuma et al. |
| 2012/0119283 | A1 | 5/2012 | Lee et al. |
| 2012/0182806 | A1 | 7/2012 | Chen et al. |
| 2013/0082341 | A1 | 4/2013 | Shimizu et al. |
| 2013/0341797 | A1 | 12/2013 | Lim |
| 2014/0264934 | A1 | 9/2014 | Chen |

OTHER PUBLICATIONS

Choi et al., "3D approaches for non-volatile memory", 2011 Symposium on VLSI Technology, Digest of Technical Papers, pp. 178-179, Jun. 14-16, 2011.
Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.
Fukuzumi et al. "Optimal Integration and Characteristics of Vertical Array Devices for Ultra-High Density, Bit-Cost Scalable Flash Memory," IEEE Dec. 2007, pp. 449-452.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.
Hu J. et al., "Reducing Write Activities on Non-volatile Memories in Embedded CMPs via Data Migration and Recomputation," Proc. of the IEEE/ACM DAC, Jun. 13-18, 2010, pp. 350-355.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.
Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.
Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.
Johnson et al., "512-Mb PROM With a Three-Dimensional Array of Diode/Antifuse Memory Cells," IEEE Journ. Solid-State Circuits 83(11), Nov. 2003, pp. 1920-1928.
Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.
Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.
Kim et al., "Three-Dimensional NAND Flash Architecture Design Based on Single-Crystalline STacked ARray," IEEE Transactions on Electron Devices, vol. 59, No. 1, pp. 35-45, Jan. 2012.
Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.
Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.
Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.
Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.
Nowak et al., "Intrinsic fluctuations in Vertical NAND flash memories," 2012 Symposium on VLSI Technology, Digest of Technical Papers, pp. 21-22, Jun. 12-14, 2012.
Paul et al., "Impact of a Process Variation on Nanowire and Nanotube Device Performance", IEEE Transactions on Electron Devices, vol. 54, No. 9, Sep. 2007, p. 2369-2376.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
U.S. Appl. No. 14/309,622, entitled "Bandgap-engineered Memory With Multiple Charge Trapping Layers Storing Charge," by Hang-Ting Lue, filed on Jun. 19, 2014, 108 pages.
Wang, Michael, "Technology Trends on 3D-NAND Flash Storage", Impact 2011, Taipei, dated Oct. 20, 2011, found at www.impact.org.tw/2011/Files/NewsFile/201111110190.pdf.

ASSIST GATE STRUCTURES FOR THREE-DIMENSIONAL (3D) VERTICAL GATE ARRAY MEMORY STRUCTURE

FIELD OF THE TECHNOLOGY DISCLOSED

The technology disclosed relates to stacked transistor structures, such as can be used in high density three-dimensional (3D) memory devices; and to memory devices utilizing such structures.

BACKGROUND

Three dimensional (3D) memory devices are characterized by multiple layers, each of which can include a planar array of memory cells. For certain three-dimensionally stacked memory devices, active layers can comprise active strips of materials configured as bit lines or word lines for memory cells, stacked in spaced-apart ridge-like structures. The active layers can be made from a doped (p-type or n-type) or undoped semiconductor material. In such 3D memory, memory cells can be disposed at the cross-points of the stacked bit lines or word lines and the crossing word lines or bit lines, forming a 3D memory array.

Examples of memory devices like this are described in commonly owned U.S. Patent Publication No. 2012/0182806, filed Apr. 1, 2011, entitled Memory Architecture of 3D Array With Alternating Memory String Orientation and String Select Structures by inventors Shih-Hung Chen and Hang-Ting Lue and are also described in commonly owned U.S. Pat. No. 8,363,476, filed 19 Jan. 2011, entitled Memory Device, Manufacturing Method And Operating Method Of The Same, by inventors Hang-Ting Lue and Shi-Hung Chen, both of which are incorporated by reference as if fully set forth herein. In these examples, the active strips are coupled to pads on each layer. The pads are arranged in stairstep structures to provide landing areas for interlayer conductors. For large arrays in particular, the resistance of the pads can be relatively high, slowing down operation of the device. Also, the current paths to the individual active strips across the array can vary, making control circuitry and sensing circuitry more complex.

DESCRIPTION OF RELATED ART

FIG. 1 is a perspective illustration of a 3D NAND-flash memory device 100, described in commonly owned U.S. Pat. No. 8,503,213 B2 which is incorporated by reference as if fully set forth herein. The device 100 illustrated in FIG. 1 includes stacks of alternating semiconductor strips and insulating strips. Insulating material is removed from the drawing to expose additional structure. For example, insulating strips are removed between the semiconductor strips, in the stacks, and are removed between the stacks of semiconductor strips.

Four semiconductor pads 102B, 103B, 104B, and 105B on a proximal end of a stack of active layers and four semiconductor pads 112A, 113A, 114A, and 115A on a distal end of the stack, are shown, but the number of active layers and the corresponding semiconductor pads can be extended to any number of layers N, where N is an integer having a value greater than one. As shown, the 3D semiconductor device includes stacks of active strips (e.g. 102, 103, 104, 105) separated by insulating material. Semiconductor pads (e.g. 102B, 103B, 104B, and 105B) terminate the strips in corresponding active layers. As illustrated, the semiconductor pads 102B, 103B, 104B, and 105B are electrically coupled to the active layers for connection to decoding circuitry to select layers within the array. Semiconductor pads 102B, 103B, 104B, and 105B can be patterned concurrently as the active layers are patterned, with the possible exception of vias for the interlayer connectors. Each of the active strips includes a semiconductor material suitable to act as a channel region in the illustrated implementation. The strips are ridge-shaped extending on the Y-axis as illustrated, so that the active strips 102, 103, 104, 105 can be configured as bodies including channel regions of flash memory cell strings, for example, in horizontal NAND string configurations. As illustrated, a layer 152 of memory material coats the plurality of stacks of active strips in this example, and at least on the side walls of the active strips in other examples. In other implementations, the active strips can be configured as word lines for vertical NAND string configurations.

Each stack of active strip in the illustrated implementation is terminated at one end by semiconductor pads and the other end by a source line. Therefore, active strips 102, 103, 104, 105 terminate on the proximal end by semiconductor pads 102B, 103B, 104B, and 105B and a source line terminal 119 on the distal end of the strips passing through gate select line 127. Active strips 112, 113, 114, 115 terminate on the distal end by semiconductor pads 112A, 113A, 114A, and 115A and a source line terminal (for example, source line 128) passing through gate select line 126 near the proximal end of the strips.

In the implementation of FIG. 1, a plurality of conductors 125-1 through 125-N is arranged orthogonally over the plurality of stacks of active strips. The conductors 125-N, have surfaces conformal with the plurality of stacks of active strips, within the trenches defined by the plurality of stacks, and defining a multilayer array of interface regions at cross-points between side surfaces of the active strips 102, 103, 104, 105 on the stacks and conductors 125-1 through 125-N (for example, word lines or source select lines). As shown, a layer of silicide (e.g. tungsten silicide, cobalt silicide, titanium silicide or nickel silicide) 154 can be formed over the top surfaces of conductors (for example, word lines or source select lines).

In one implementation of device 100, a multilayer array is formed on an insulating layer, and includes a plurality of word lines (WLs) 125-1, ..., 125-n conformal with the plurality of stacks. The plurality of stacks includes semiconductor strips 112, 113, 114, and 115 in multiple planes. The word line numbering shown in FIG. 1, ascending from 125-1 to 125-N going from the back to the front of the overall structure, applies to even memory pages. For odd memory pages, the word line numbering descends from 125-N to 125-1 going from the back to the front of the overall structure.

A layer of memory material is disposed in interface regions at cross-points between surfaces of the semiconductor strips 112-115 and 102-105 and the plurality of word lines 125-1 through 125-n. Ground select lines (GSL) 126 and GSL 127 are conformal with the plurality of stacks, similar to the word lines.

Bit lines and string select lines are formed at the metals layers ML1, ML2, and ML3. Bit lines are coupled to a plane decoder (not shown). String select lines are coupled to a string select line decoder (not shown).

The GSL gate structures 126 and 127 can be patterned during the same step that the word lines 125-1 through 125-n are defined. Ground select devices are formed at cross-points between surfaces of the plurality of stacks and GSL gate structures 126 and 127. The string select line (SSL) gate structures 119 and 109 can be patterned during the same step that the word lines 125-1 through 125-n are defined. String select devices are formed at cross-points between surfaces of the plurality of stacks and SSL gate structures 119 and 109. These devices are coupled to decoding circuitry for selecting the strings within particular stacks in the array.

Depending upon the implementation, layer 152 of memory material can comprise multilayer dielectric charge storage structures, as described in co-pending U.S. patent application Ser. No. 14/309,622 that is incorporated by reference as if fully set forth herein. For example, a multilayer dielectric charge storage structure includes a tunneling layer comprising a silicon oxide, a charge trapping layer comprising a silicon nitride, and a blocking layer comprising a silicon oxide. In some examples, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 152 of memory material can comprise only a charge trapping layer without the tunneling layer or the blocking layer.

In the alternative, an anti-fuse material such as a silicon dioxide, silicon oxynitride or other silicon oxides, for example having a thickness on the order of 1 to 5 nanometers, can be utilized. Other anti-fuse materials can be used, such as silicon nitride. For anti-fuse implementations, active strips 102, 103, 104, 105 can be a semiconductor material with a first conductivity type (e.g. p-type). Conductors (for example, word lines or source select lines) 125-N can be a semiconductor material with a second conductivity type (e.g. n-type). For example, the active strips 102, 103, 104, 105 can be made using p-type polysilicon while the conductors 125-N can be made using relatively heavily doped n+-type polysilicon or relatively heavily doped p+-type polysilicon. For anti-fuse implementations, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other implementations, different programmable resistance memory materials can be used as the memory material, including metal oxides like tungsten oxide on tungsten or doped metal oxide, and others. Some of such materials can form devices that can be programmed and erased at multiple voltages or currents, and can be implemented for operations storing multiple bits per cell.

As can be seen in FIG. 1, the semiconductor pads 102B, 103B, 104B, and 105B are coupled on one side to active strips in the corresponding layer of the device, such as by being formed of a continuous patterned layer of semiconductor. In some implementations, the pad can be coupled on two sides to active strips in the corresponding layer. In other implementations, the pads can be connected to the active strips using other materials and structures that allow for electrical communication of the voltages and currents needed for operation of the device. Also, the semiconductor pads 102B, 103B, 104B, and 105B, except the lowermost pad, include openings or contacts 102C1, 102C2, 103C1, 103C2, 104C, that expose landing areas on underlying pads forming a stairstep structure in this example. The openings define inside perimeters on the pads.

The interleaved pattern shown in FIG. 1 is only exemplary and may not be used in other implementations of the technology disclosed. One example of such implementations is a 3D NAND-flash memory array structure in which the semiconductor pads and string select structures are all disposed on one side of the block.

SUMMARY

A 3D array of memory cells with one or more blocks is described. The blocks include a plurality of layers. The layers in the plurality include semiconductor strips which extend from a semiconductor pad. The layers are disposed so that the semiconductor strips in the plurality of layers form a plurality of stacks of semiconductor strips and a stack of semiconductor pads. Also, a plurality of select gate structures are disposed over the stacks of semiconductor strips in the plurality of stacks between the semiconductor pads and memory cells on the semiconductor strips. Different ones of the plurality of select gate structures couple the semiconductor strips in different ones of the stacks of semiconductor strips to the semiconductor pads in the plurality of layers. In addition, at least one assist gate structure is disposed over the plurality of stacks between the select gate structures and the stack of semiconductor pads. In some implementations, the assist gate structure includes a horizontal portion overlapping the semiconductor pads on at least one side.

Bias circuitry can be connected to the assist gate structure to apply a gate voltage in response to addresses selecting a memory cell in a block when the select gate structure is turned on. Applying a gate voltage to the assist gate structure can cause a local inversion channel (i.e. an increase in the concentration of charge carriers) to form in the semiconductor strips near the assist gate structure, and reduce resistivity in current paths from the semiconductor pads to the memory cells on the semiconductor strips. The semiconductor pads can comprise landing areas for interlayer connectors, and include openings in the stack of semiconductor pads configured to provide vias for connection between the landing areas on the semiconductor pads to overlying conductors. Further, regions in the landing areas can have higher doping concentration relative to other regions of the semiconductor pads.

The semiconductor strips can comprise NAND string channels. A plurality of word lines can overlie the plurality of the stacks of semiconductor strips. The word lines can include vertical gate structures between the stacks in the plurality of stacks. In some implementations, a dielectric charge storage layer is disposed at least on sidewalls of the plurality of stacks between the vertical gate structures and the semiconductor strips. The assist gate structure can likewise include a conductor overlying the plurality of stacks with vertical gate structures between the stacks in the plurality of stacks, and the dielectric charge storage layer can be disposed as a gate dielectric layer between the vertical gate structures and the semiconductor strips.

In other implementations, the assist gate structure includes a conductor overlying the plurality of stacks with vertical gate structures between the stacks in the plurality of stacks and a gate dielectric layer between the vertical gate structures and the semiconductor strips.

In yet other implementations, the assist gate structure is separated from the semiconductor pads on at least one side by a gate dielectric layer, and under bias can induce an inversion channel along a side of the semiconductor pads.

In further implementations, the array includes one or more lateral assist gate structures connected to the select gate structures.

Other aspects and advantages of the technology disclosed can be seen on review of the drawings, the detailed description and the claims, which follow.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings, in which.

DESCRIPTION

Figure 1:
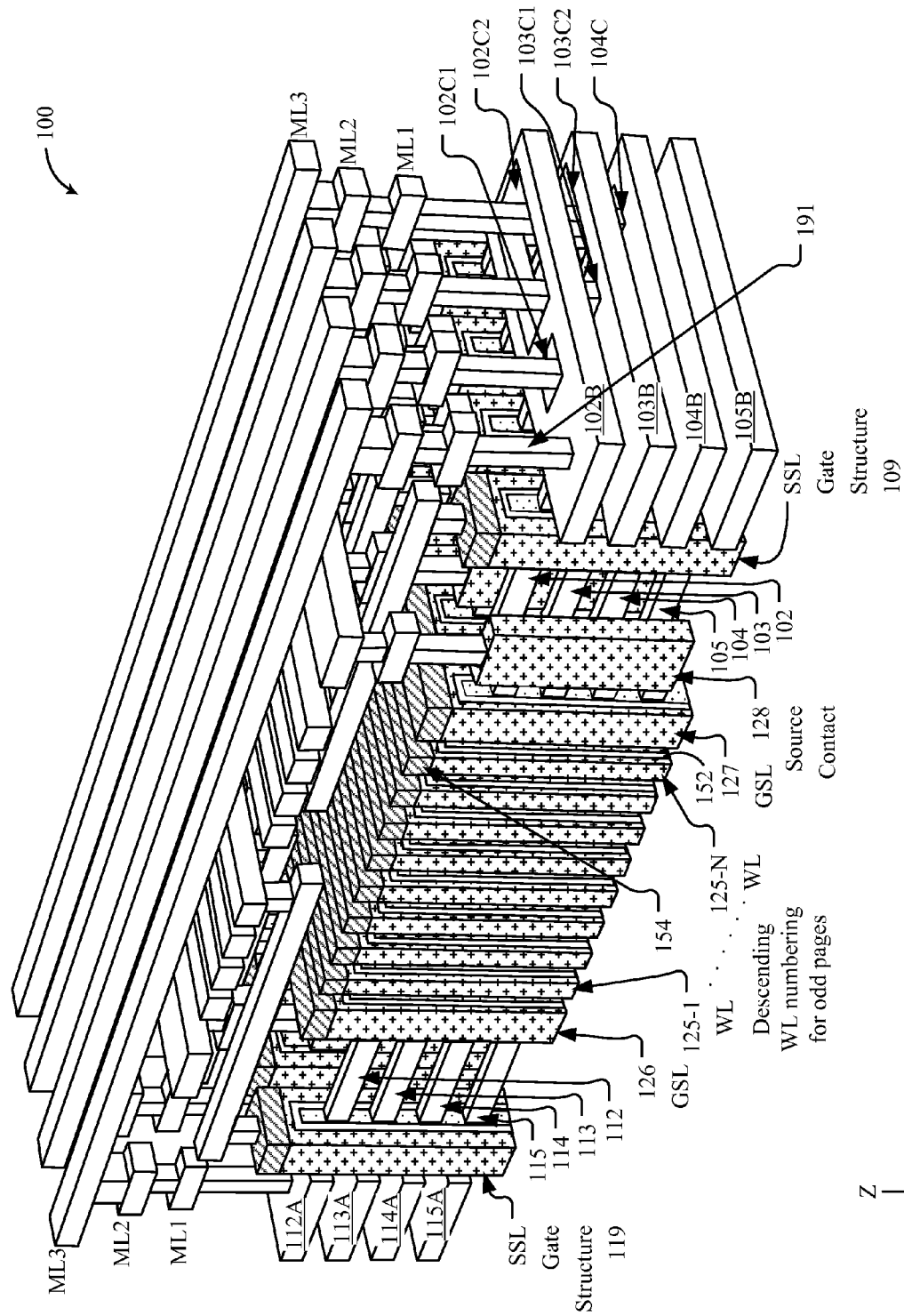
FIG. 1 shows a perspective drawing of a 3D NAND-flash memory array structure including semiconductor pads for interlayer contact conductors.

A detailed description of various implementations is described with reference to the figures. The following description will typically be with reference to specific structural implementations and methods. It is to be understood that there is no intention to limit the technology disclosed to the specifically disclosed implementations and methods, but that the technology disclosed may be practiced using other features, elements, methods and implementations. Preferred implementations are described to illustrate the technology disclosed, not to limit its scope, which is defined by the claims. Those of ordinary skill in the art will recognize a variety of equivalent variations on the description that follows. Like elements in various implementations are commonly referred to with like reference numerals.

Figure 2:
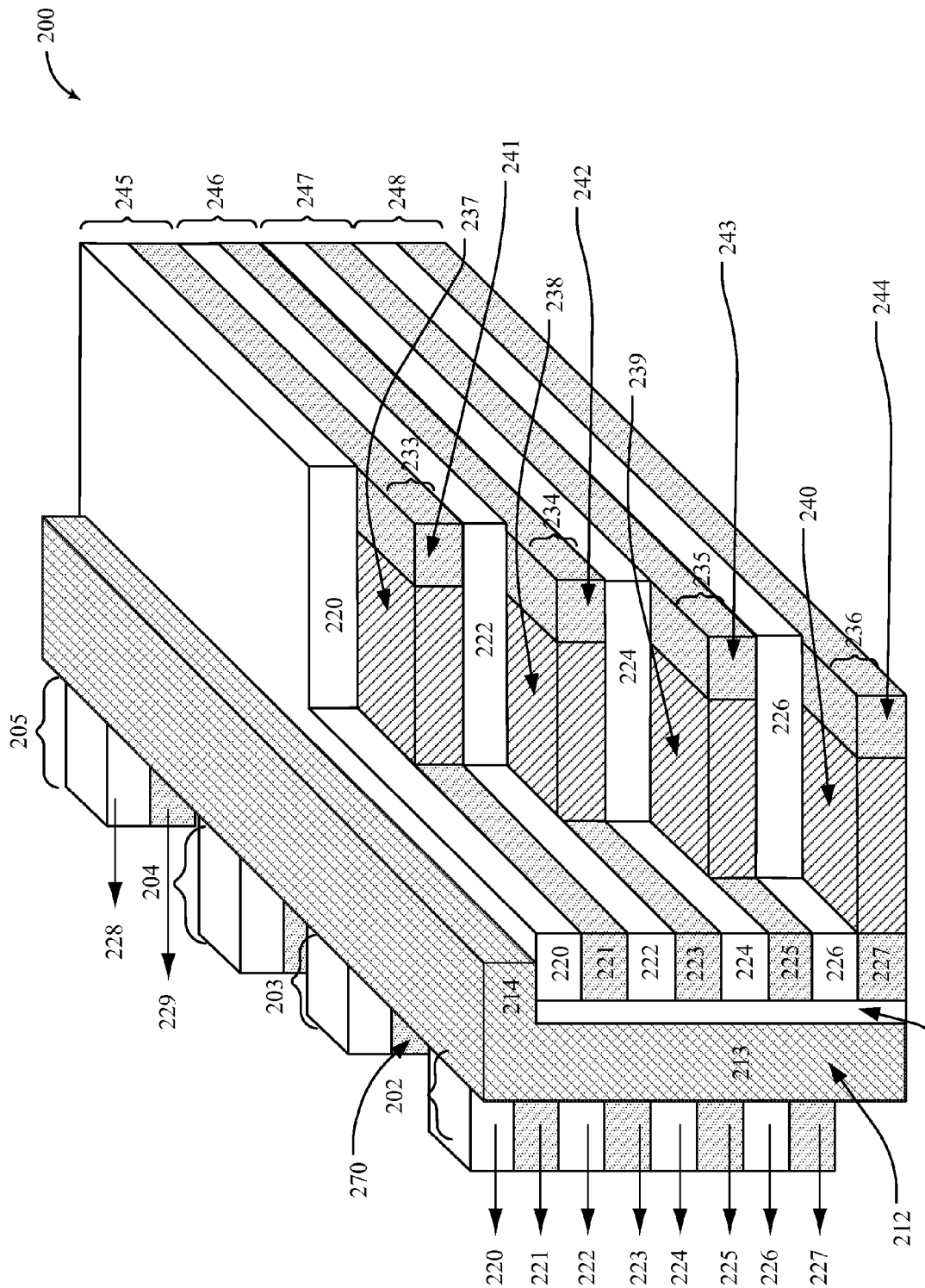
FIG. 2 is a perspective diagram illustrating an assist gate structure (AG) disposed over a plurality of stacks between select gate structures and a stack of semiconductor pads.

FIG. 2 is a perspective cut view 200 of a 3D NAND-flash memory array that comprises an assist gate structure 212 disposed over a plurality of stacks 202, 203, 204, and 205 between select gate structures (e.g., 406, 408) and a stack of semiconductor pads 245, 246, 247, and 248. The implementation of FIG. 2 can employ a SSL/GSL ONO (string select line/ground select line oxide-nitride-oxide) approach as described herein.

In the layout view of FIG. 2, the array includes a plurality of semiconductor strips (e.g., 221, 223, 225, and 227) at a plurality of levels, forming stacks 202, 203, 204, and 205. The active strips comprise thin film strips of semiconductor material configured to act as channels for NAND strings. The semiconductor strips can be lightly-doped n-type or p-type or undoped so as to act as channels for the memory cells. For instance, the semiconductor strips 221, 223, 225, and 227 can be lightly doped with a relatively low concentration of impurities, such as a doping concentration of about $10^{15}$ cm$^{-3}$, or alternatively can be an intrinsic, undoped, semiconductor material.

Stacks of semiconductor strips 202, 203, 204, and 205 comprise of alternating semiconductor strips and insulating strips. In one implementation, stack 202 includes alternating semiconductor strips 221, 223, 225, and 227 and insulating strips 220, 222, 224, and 226, while stack 205 includes alternating semiconductor strip 229 and insulating strip 228. Sides of the insulating strips are recessed relative to sides of the semiconductor strips in one example, so at least one side of the stack includes recesses between the semiconductor strips, in some implementations.

Each of the stacks of semiconductor strips 202, 203, 204, and 205 is terminated at one end by a stack of semiconductor pads and the other end by a source line. For example, semiconductor strips 221, 223, 225, and 227 terminate on the proximal end by a stack of semiconductor pads 245, 246, 247, and 248 and a source line terminal (not shown) on the distal end of the strips passing through a GSL gate structure (e.g., 406).

Stack of semiconductor pads 245, 246, 247, and 248 terminate semiconductor strips, such as semiconductor strips 221, 223, 225, and 227. These semiconductor pads 245, 246, 247, and 248 are electrically connected to different bit lines for connection to decoding circuitry to select planes within the array. These semiconductor pads 245, 246, 247, and 248 can be patterned at the same time that the plurality of ridge-shaped stacks is defined.

The semiconductor pads 245, 246, 247, and 248 for each block in the array can be arranged in a stairstep structure as similarly illustrated in FIG. 1, with landing areas 233, 234, 235, and 236 for each successive bit line disposed on a step of the stairstep structure. Stack of semiconductor pads 245, 246, 247, and 248 can be arranged in patterns of a simple stairstep or other suitable patterns. The interlayer connector (e.g., 191) couple the semiconductor pads 245, 246, 247, and 248 to overlying bit lines in a patterned conductor layer (e.g., ML3 shown in FIG. 1). The overlying bit lines are connected to peripheral circuits supporting operations of the 3D vertical gate memory array. For example, the interlayer connectors can couple the semiconductor pads 245, 246, 247, and 248 to overlying patterned conductors that connect to a page buffer. The page buffer can store data that is written to or read from selected memory cells in the 3D vertical gate memory array.

Landing areas 233, 234, 235, and 236 are exposed beneath openings in the stack of semiconductor pads 245, 246, 247, and 248 which provide vias for connection between the semiconductor pads and the overlying conductors. The semiconductor pads 245, 246, 247, and 248 can be formed using one or more pattern and etch processes using a successively decreasing length of a masking layer to form each of the exposed landing areas. Detail of various methods to form the stairstep structure are described in, for example, commonly owned U.S. Pat. No. 8,383,512, filed on May 14, 2011, entitled Method for Making Multilayer Connection Structure by inventors Shih-Hung Chen, Hang-Ting Lue, Hong-Ji Lee, and Chin-Cheng Yang, which is incorporated by reference as if fully set forth herein.

In one implementation, regions 237, 238, 239, and 240 in the landing areas 233, 234, 235, and 236 have higher doping concentration relative to other regions 241, 242, 243, and 244 of the semiconductor pads 245, 246, 247, and 248. According to some implementations, this is achieved by subjecting the landing areas 233, 234, 235, and 236 to implantation process using impurities. In one implementation, impurities can have the same conductivity type (n-type or p-type) as the semiconductor strips 221, 223, 225, and 227 or the semiconductor pads 245, 246, 247, and 248. In another implementation, impurities can have a different conductivity type from the semiconductor strips 221, 223, 225, and 227 or the semiconductor pads 245, 246, 247, and 248. In this drawing, four semiconductor pads 245, 246, 247, and 248 in four active layers and corresponding stacks 202, 203, 204, and 205 of active strips layers are illustrated and the stack of semiconductor pads 245, 246, 247, and 248 is front-facing. The insulating layers between the semiconductor pads are not shown for purposes of clarity.

In one implementation, impurities are implanted at an incident angle or angles tilted to cause implantation in the outside perimeter regions of the pads, where the tilt angles can be for example 0, 45, or 89 degrees relative to a normal substrate surface (commonly referred as tilt angle). During implantation, a substrate at the bottom of the stacks 202, 203, 204, and 205 can also be rotated in the XY plane allowing for the impurity ions to be incident at one or more angle relative to a crystal plane of the substrate (twist angle). In various implementations, the tilt angle, the twist angle, and the ion energy, and others are selected such that a lower resistance region is formed in regions 237, 238, 239, and 240 in the landing areas 233, 234, 235, and 236, thus some implementations may be made without layer-by-layer doping the semiconductor pads 245, 246, 247, and 248.

Additionally, the impurities can be implanted while the semiconductor strips in the stacks 202, 203, 204, and 205 are covered by a mask, so that the implantation process does not substantially change the resistance of the strips of active material in the plurality of active layers.

Dielectric charge storage layer 232 can be a multilayer dielectric, such as an oxide-nitride-oxide (ONO) dielectric material, used in memory cells for charge storage. A small sidewall recess can be obtained by optimizing the processing. A conformal ONO is deposited at the sidewalls of the semiconductor strips 221 through 227, according to one implementation. In another implementation, the dielectric charge storage layer 232 is disposed at least on sidewalls of the plurality of stacks before forming the word lines.

3D NAND-flash memory array shown in diagram 200 also includes an assist gate structure 212 placed adjacent to the stack of semiconductor pads 245, 246, 247, and 248. The distance between the assist gate structure 212 and the semiconductor pads is very small, with only the dielectric charge storage layer 232 separating the two. In one implementation, the assist gate structure 212 is arranged orthogonally over the stacks of semiconductor strips 202, 203, 204, and 205. In another implementation, the assist gate structure 212 has a surface conformal with the stacks of semiconductor strips 202, 203, 204, and 205, filling the trenches (e.g., 270) defined by the plurality of stacks 202, 203, 204, and 205, and defining the multi-layer array of interface regions at cross-points between side surfaces of the semiconductor material strips on the stacks 202, 203, 204, and 205.

In other implementations, assist gate structure 212 includes a vertical portion 213 adjacent to the stacks 202, 203, 204, and 205 on at least one side, and includes a horizontal extension portion 214 on one side of the vertical portion 213. In some implementations, the horizontal extension portion 214 overlaps the semiconductor pads 245, 246, 247, and 248 on at least one side. In yet other implementations, the assist gate structure 212 includes a conductor 228 overlying the plurality of stacks 202, 203, 204, and 205 with a plurality of vertical gate structures (e.g., 213) between the stacks in the plurality of stacks. In further implementations, the dielectric charge storage layer (e.g., 232) is disposed as a gate dielectric layer between the vertical gate structures and the semiconductor strips.

Applying a gate voltage to the assist gate structure 212 can cause a local inversion channel (i.e. an increase in the concentration of charge carriers) to form in the semiconductor strips 221, 223, 225, and 227, and reduce resistivity in current paths from the stack of semiconductor pads 245, 246, 247, and 248 to the memory cells on the semiconductor strips 221, 223, 225, and 227.

Also, applying a gate voltage to the assist gate structure 212 can cause a local inversion channel and reduce resistivity in the region immediately between the assist gate structure 212 and the stack of semiconductor pads 245, 246, 247, and 248.

In addition, applying a gate voltage to the assist gate structure 212 can cause a local inversion channel and reduce resistivity in the region in the stack of semiconductor pads 245, 246, 247, and 248 immediately adjacent to the assist gate structure 212.

Due to the stairstep structure of the stack of semiconductor pads 245, 246, 247, and 248, the current flow path from the stack of semiconductor pads 245, 246, 247, and 248 to the semiconductor strips 221, 223, 225, and 227 can be an uneven load on each level of the 3D NAND-flash memory array and also on each of the semiconductor strips 221, 223, 225, and 227. The assist gate structure 212 solves this technical problem by creating an inversion channel in the region immediately between the assist gate structure 212 and the stack of semiconductor pads 245, 246, 247, and 248 and in the region in the stack of semiconductor pads 245, 246, 247, and 248 immediately adjacent to the assist gate structure 212. This inversion channel reduces the resistivity in the semiconductor strips 221, 223, 225, and 227 and thus improves the current flow path from the stack of semiconductor pads 245, 246, 247, and 248 to the semiconductor strips 221, 223, 225, and 227.

Figure 3:
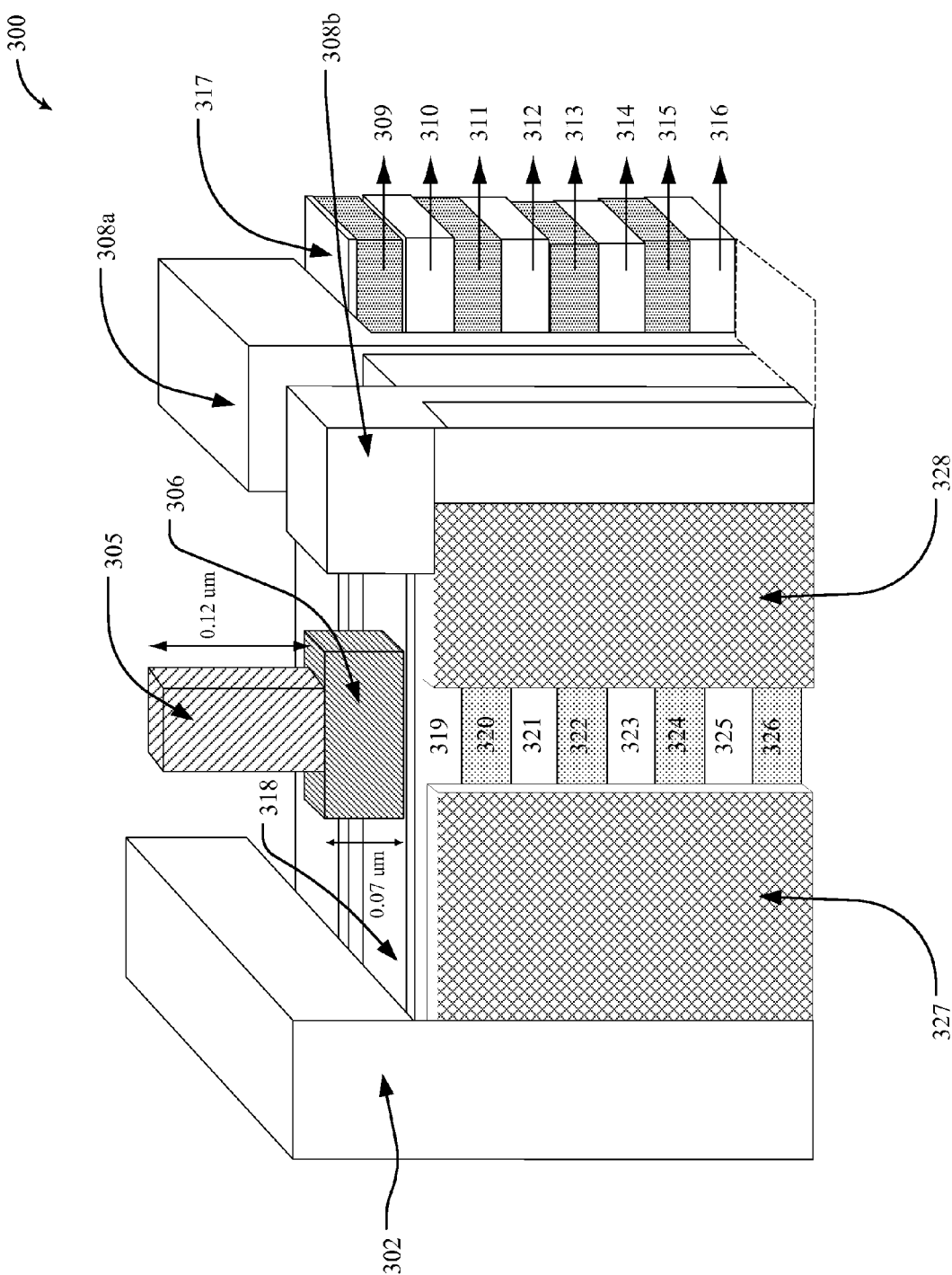
FIG. 3 depicts a side view diagram of lateral assist gate structures (LAG) disposed over a plurality of stacks between select gate structures.

FIG. 3 is cross-section cut view 300 of a 3D NAND-flash memory array that depicts lateral assist gate structures 327 and 328 disposed over a plurality of stacks (e.g., 317 and 318) between the GSL gate structure 302 and SSL gate structures 308*a-b*.

In three-dimensional memory (3D) devices, such as the one illustrated by FIG. 1, there can be a relatively high resistance in channels (e.g., semiconductor strips 112-115 and 102-105) passing through the SSL gate structures (e.g., 119 and 109) and the GSL gate structures (e.g., 126 and 127), degrading performance of the 3D memory devices.

Any given stack of semiconductor strips is coupled to either one of the stacks of semiconductor pads located on opposite ends of the 3D NAND-flash memory array, but not both. In an array configured as shown in the example of FIG. 1, a stack of semiconductor strips has one of the two opposite orientations of semiconductor pad end-to-source line end orientation, or source line end-to-semiconductor pad end orientation. For example, the stack of semiconductor strips 317 with semiconductor strips 310, 312, 314, and 316 has semiconductor pad end-to source line end orientation; and the stack of semiconductor strips 318 with semiconductor strips 319, 321, 323, and 325 has source line end-to-semiconductor pad end orientation. In other implementations, the interleaved pattern may not be used, and the semiconductor pads and string select structures may be all disposed on one side of the block.

Overlying the stack of semiconductor strips with semiconductor strips, are the vertical word lines (not shown) and the vertical GSL gate structure 302. Also overlying the stacks of semiconductor strips are the SSL gate structures 308*a-b*. The SSL gate structures 308*a-b* overlie every other stack of semiconductor strips at the top end of the semiconductor strips, and overlie every other stack of semiconductor strips at the bottom end of the semiconductor strips. In either case, the SSL gate structures 308*a-b* control electrical connection between any stack of semiconductor strips and the stack's corresponding semiconductor pad.

In one implementation, the GSL gate structure 302 and SSL gate structures 308*a-b* are formed with anisotropic etches. Anisotropic etches produce, well-controlled features, such that the outside surfaces of the horizontal extension portions of the gate structures can be vertically, or near vertically, planarized or flush with the overhanging sides of the semiconductor strips 309, 311, 313, and 315.

FIG. 3 shows one side of the SSL gate structure 308*b* spaced away along the stacks from the GSL gate structure 302. The GSL gate structure 302 can be used for ground select lines, while the SSL gate structures 308*a-b* can be used for string select lines. When voltage is applied to the SSL gate structures 308*a-b* to turn on the SSL switch (not including the transistors), the channel regions in the semiconductor strips turn on, causing inversion layers to be induced in the semiconductor strips. Similarly, when voltage is applied to the GSL gate structure 302 to turn on the GSL switch (not including the transistors), the channel regions in the semiconductor strips turn on, causing inversion layers to be induced in the semiconductor strips.

Contact plug 306 couples the semiconductor strips to source contact 305. Contact plug 306 can comprise doped polysilicon, tungsten or other vertical interconnect technologies. Although not shown in the figure, the plug 306 contacts each layer in the stack, including the semiconductor strips (e.g., 309, 311, 313, 315, 319, 321, 323, and 325). In one implementation, a height difference between the contact plug 306 and bottom of the stacks provide better isolation and process window between the source contact 305 and the GSL gate structure 302 and SSL gate structures 308*a-b*. In one implementation, the source contact (SC) 305 is 0.12 um long and is coupled to the contact plug 306 of length 0.07 um.

In one implementation, 3D NAND-flash memory array shown in FIG. 3 uses lateral assist gate structures 327 and 328 to reduce the resistance of the semiconductor strips in the stacks that include alternating semiconductor strips (e.g., 309, 311, 313, 315, 319, 321, 323, and 325) and insulating strips (e.g., 310, 312, 314, 320, 322, 324, and 326). This is achieved by respectively placing the lateral assist gate structures 327 and 328 between the GSL gate structure 302 and SSL gate structure 308*b*. When voltage is applied to the lateral assist gate structures 327 and 328, an inversion layer with lower resistance is formed in the semiconductor strips, beneath the gate structures 302 and 308*b*.

The lateral assist gate structures 327 and 328 are connected to the GSL gate structure 302 and SSL gate structure 308*b* and can be extensions of the GSL gate structure 302 and SSL gate structure 308*b*. Unlike the GSL gate structure 302 and SSL gate structure 308*b*, the lateral assist gate structures 327 and 328 do not overlap the semiconductor strip 309, 311, 313, 315, 319, 321, 323, and 325.

In other implementations, applying a gate voltage to the lateral assist gate structures 327 and 328 can cause a local inversion channel in stack 318 with semiconductor strips 319, 321, 323, and 325 and source line end-to-semiconductor pad end orientation, which is adjacent to the stack 317 with semiconductor pad end-to-source line end orientation.

The stacks are wrapped with dielectric material, such as an oxide-nitride-oxide (ONO), to provide a gate dielectric and prevent a short circuit between the semiconductor strips of the stacks and the lateral assist gate structures 327 and 328.

Figure 4A:
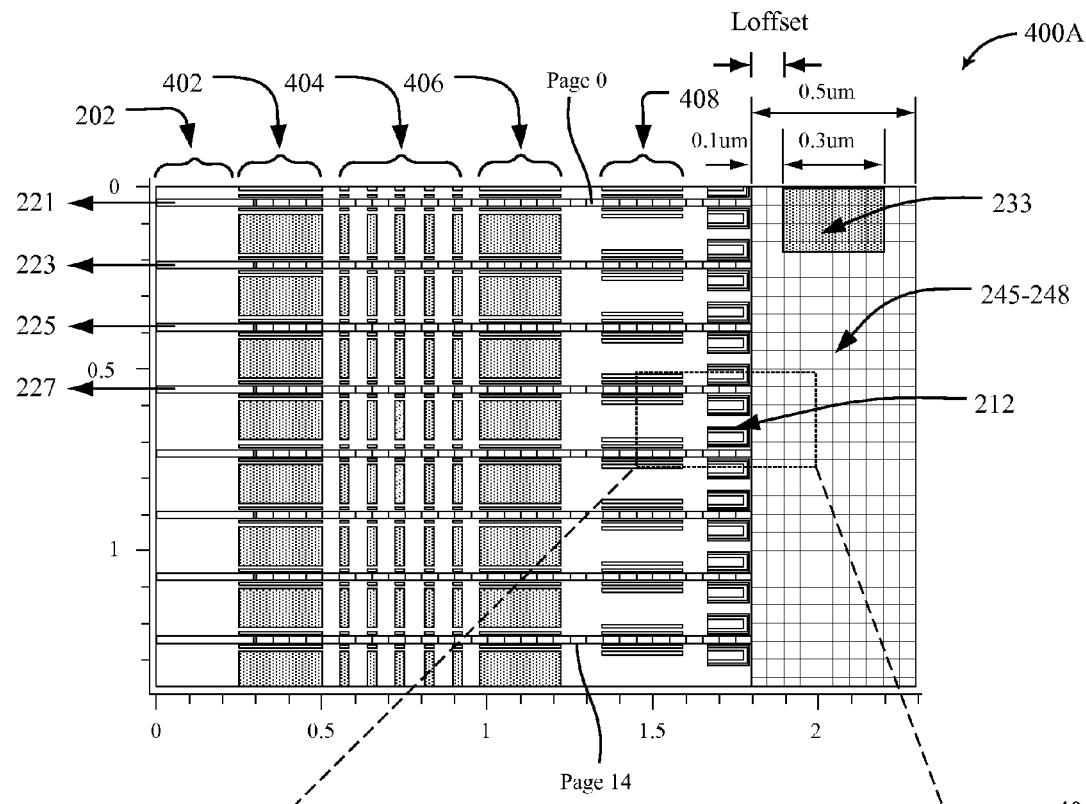
FIG. 4A is a layout illustration of the 3D NAND-flash memory array shown in FIG. 2.

FIG. 4A is a layout illustration 400A of the 3D NAND-flash memory array shown in FIG. 2. The device can be made, for example, with a 43-nm half-pitch. In this simulation, a center WL is selected to read. FIG. 4A is layout used for simulation of a 4-layer vertical gate, thin-film-transistor, BE-SONOS charge trapping NAND device that has also been fabricated and tested. The device was made with a 75 nm half-pitch. The channels are about 43 nm thick.

In the layout view of FIG. 4A, the stack of semiconductor strips 202 with semiconductor strips 221, 223, 225, and 227 is shown as horizontal. In the layout 400, adjacent stacks of semiconductor strips alternate between the opposite orientations, of semiconductor pad end-to-source line end orientation, and source line end-to-semiconductor pad end orientation. For instance, stack 202 terminates at the stack of semiconductor pad 245, 246, 247, and 248, whereas the stack adjacent to the stack 202 (not shown) has semiconductor strips that don't terminate at the stack of semiconductor pad 245, 246, 247, and 248 but instead at a source line (not shown). Also, every other stack of semiconductor strips runs from the semiconductor pad structure at the top, to the source line at the bottom. Every other stack of semiconductor strips runs from the source line at the top, to the semiconductor pad structure at the bottom.

The stack of semiconductor strips 202 with semiconductor strips 221, 223, 225, and 227 is terminated at one end by the stack of semiconductor pads 245, 246, 247, and 248, passes through SSL gate structure 408, GSL gate structure 406, word lines 404, GSL gate structure 402, and terminated at the other end by a source line (not shown). The stack of semiconductor strips 202 with semiconductor strips 221, 223, 225, and 227 does not reach the stack of semiconductor pads on opposite end of the 3D NAND-flash memory array.

A layer of memory material separates the word lines 404, from the semiconductor strips 221, 223, 225, and 227. GSL gate structures 406 and 402 are conformal with the plurality of ridge shaped stacks, similar to the word lines.

In one implementation, assist gate structure 212 is placed adjacent to the stack of semiconductor pads 245, 246, 247, and 248. The distance between the assist gate structure 212 and the semiconductor pads is very small, with only the dielectric charge storage layer 232 separating the two. In one implementation, the assist gate structure 212 is arranged orthogonally over the stack 202. In another implementation, the assist gate structure 212 has a surface conformal with the stack 202.

Applying a gate voltage to the assist gate structure 212 can cause a local inversion channel (i.e. an increase in the concentration of charge carriers) to form in the semiconductor strips 221, 223, 225, and 227 that have semiconductor pad end-to-source line end orientation, and reduce resistivity of current paths from the stack of semiconductor pads 245, 246, 247, and 248 to the memory cells on the semiconductor strips 221, 223, 225, and 227.

In the illustrated implementation, applying a gate voltage to the assist gate structure 212 can cause a local inversion channel in the region 410 (depicted with dotted circles) immediately adjacent the assist gate structure 212 within the stack of semiconductor pads 245, 246, 247, and 248.

In addition, applying a gate voltage to the assist gate structure 212 can cause a local inversion channel and reduce resistivity in the region in the stack of semiconductor pads 245, 246, 247, and 248 immediately adjacent to the assist gate structure 212.

In the illustrated implementations, applying a gate voltage to the assist gate structure 212 can cause a local inversion channel in stacks of semiconductor strips adjacent to the stack 202 (not shown) that have source line end-to-semiconductor pad end orientation, which do not terminate at the stack of semiconductor pad 245, 246, 247, and 248 but rather at a source line (not shown).

Figure 4B:
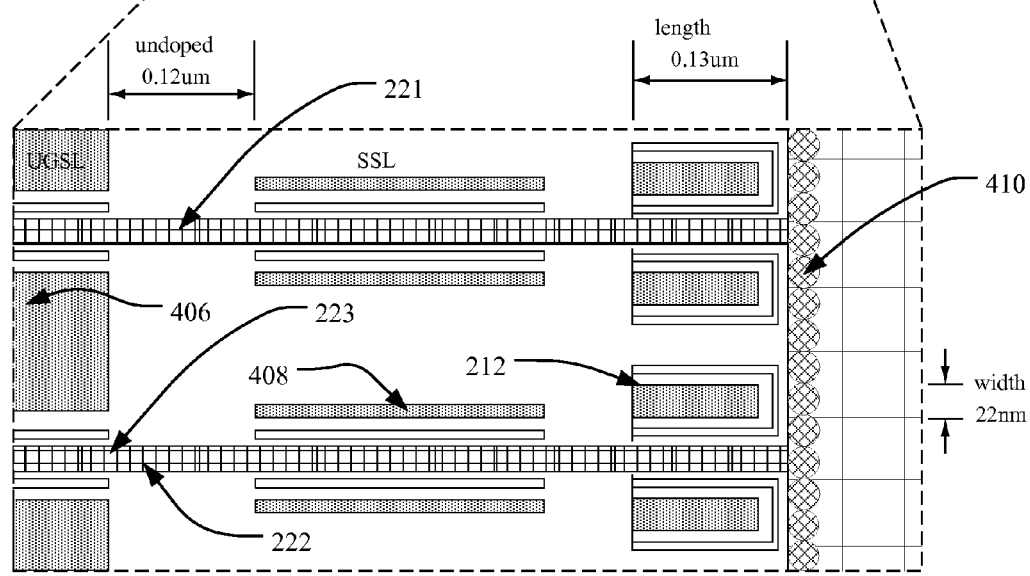
FIG. 4B is a zoomed-in view of the layout illustration of FIG. 4A and describes pitch and cell dimension of the 3D NAND-flash memory array shown in FIG. 2.

FIG. 4B is a zoomed-in view 400B of the layout illustration of FIG. 4A and describes pitch and cell dimension of the 3D NAND-flash memory array shown in FIG. 2. Like reference numerals are utilized in this figure, and not described again. Simulations 400A and 400B can be performed using TCAD (technology computer aided design); a simulation tool provided by Synopsys, Inc., that supports simulation of random grain boundaries and trap locations in memory cells.

To simply simulate architecture and improve simulation efficiency, a 2-D junction-free vertical gate (VG) NAND-flash architecture with p-type channel doping and a 43-nm half-pitch is simulated, as shown in FIG. 4A. In this simulation, the channel doping is p-type at a concentration of 1e15 $cm^{-3}$. The channel thickness (BL CD) is 30 nm. The simulated word-line (WL) number is 6 with one string selected line (SSL)/ground selected line (GSL). The WL width is 30 nm and the channel length of SSL/GSL is 0.25 µm. The ONO thickness is 5/7/10 nm or 22 nm with a 25-nm-thick p+-poly-Si gate electrode. The poly gate has p-type doping of 5e19 $cm^{-3}$. The semiconductor pad of length 05.um is relatively slightly doped or undoped relative to the landing areas of length 0.3 um. In other implementations, different values for these parameters can be used.

Regarding the junction profile, p+ junctions are used outside the SSL/GSL, whereas devices inside the NAND array are junction-free. To extract cell characteristics, the central WL is selected and read. When the transfer characteristics of the selected cell are read, 6 V is applied as the pass gate voltage and 3.3 V is set at the SSL/GSL. Drain voltage is 1 V. $V_t$ is defined as the gate voltage when drain current=100 nA. The locations and shapes of grain boundaries are randomly generated for the simulation. To simplify the analysis of grain boundary effect further, at least one artificial limitation of grain size is imposed as 50 nm. In other implementations, different artificial limitations can be imposed such as a grain angle being within ±45°.

Regarding the interface trap density ($D_{it}$), $D_{it}$ is defined as the density of electrical traps located at an interface between two layers of the memory array 200. It is specified that in this text $D_{it}$ and "interface trap density" are understood as equivalent. $D_{it}$ is an important parameter since it has an influence on the mobility of electrical carriers in the layers of the multilayer wafer.

According to one implementation, the assist gate structure 212 can be 0.13 um in length and 22 nm in width. Adjacent to the assist gate structure 212 and within the perimeter of the stack of semiconductor pads 245, 246, 247, and 248 are the landing areas like landing area 233. In one implementation, the distance between the assist gate structure 212 and landing area 233 is 0.05 um.

Figure 5A:
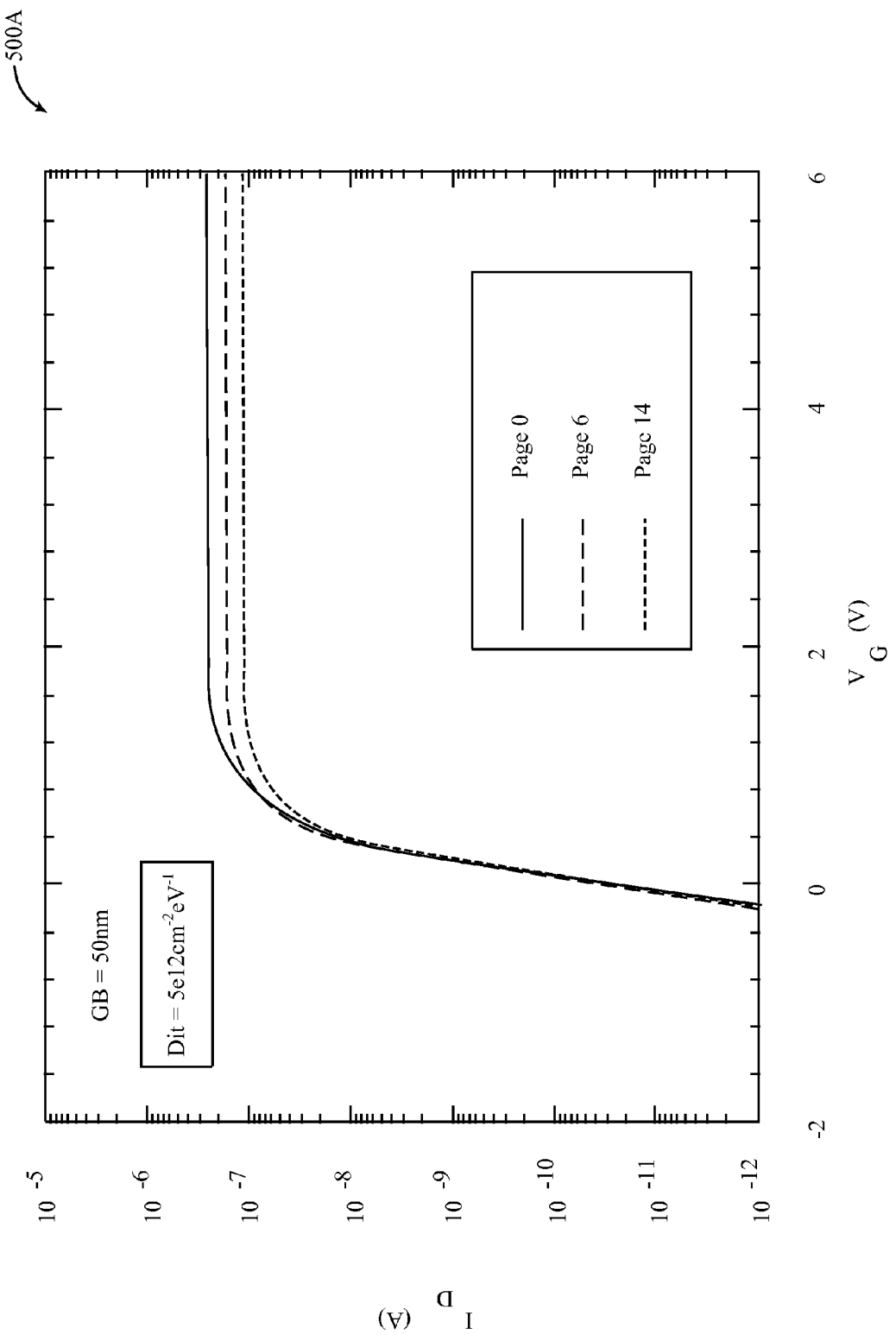
FIG. 5A describes electrical characteristics of a 3D NAND-flash memory array that comprises at least one assist gate structure using Id-Vg characteristic curves.
Figure 5B:
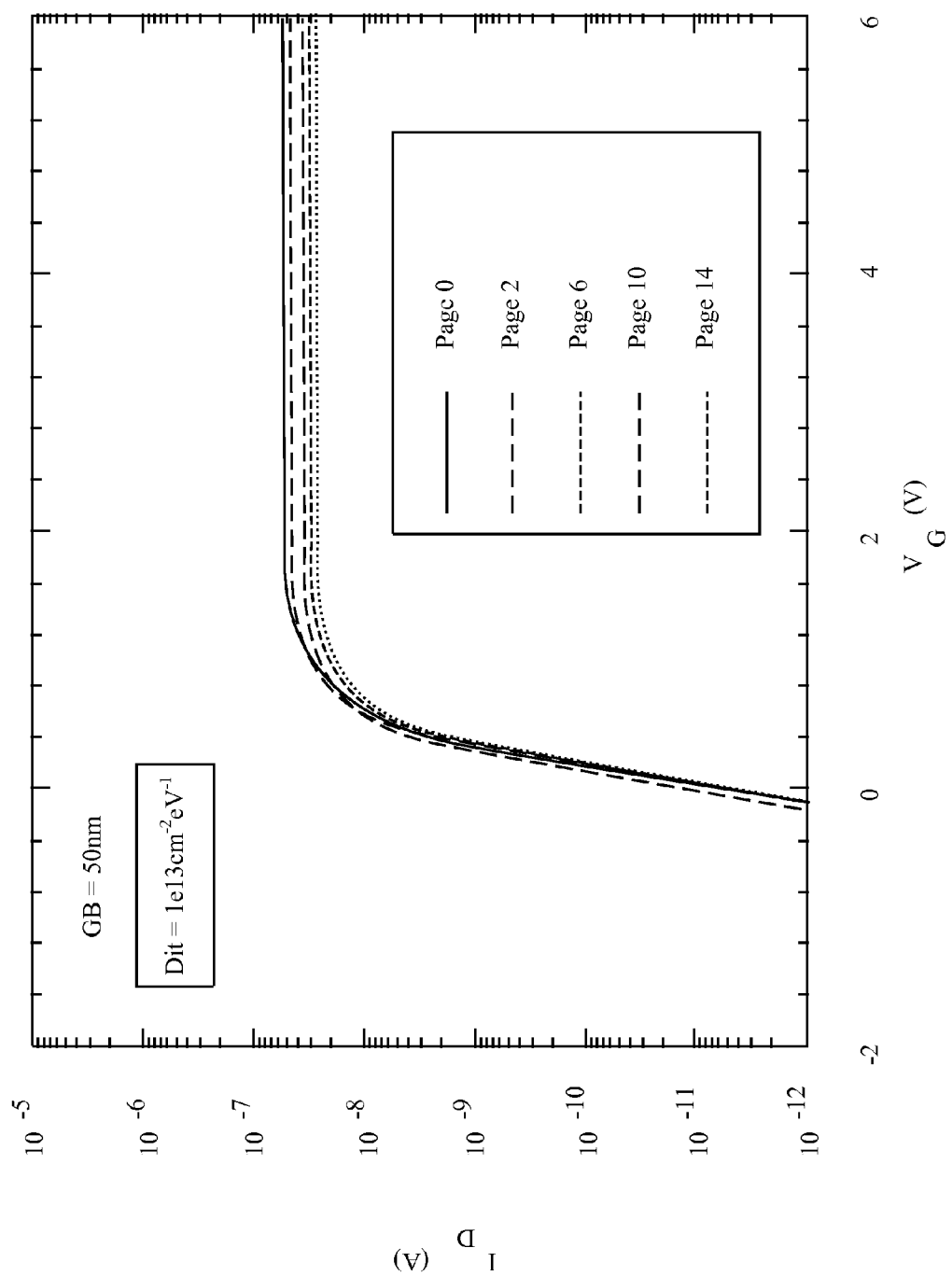
FIG. 5B describes electrical characteristics of a 3D NAND-flash memory array that comprises at least one assist gate structure using Id-Vg characteristic curves.

In the following description, different device parameters are evaluated regarding the cell performance. With reference to FIGS. 5A-5B, two Id-Vg graphs 500A and 500B are shown. Since all the other geometric conditions are fixed, the variations in Id-Vg curves are attributed to the different interface trap densities and the randomly distributed grain boundaries.

Electrical characteristics of the 3D NAND-flash memory array that comprises at least one assist gate structure can be described with reference to FIG. 5A, which shows the relation of gate current (Id) versus drain voltage (Vg) of the memory array. In particular, graph 500A depicts the impact on cell performance of using poly crystalline silicon of grain size of 50 nm and interface trap density ($D_{it}$) of 5e12 $cm^{-2}ev^{-1}$. In other implementations, other device characteristics can be used such as channel lengths, channel widths, bit line voltage, program time, erase time, program-erase cycling, and conduction band.

In graph 500A, three Id-Vg characteristic curves are plotted: the solid line curve is that of memory page 0 of the memory array; the first dashed line curve is that of memory page 6 of the memory array; and the second dashed line curve is that of memory page 14 of the memory array. Comparing the three memory page characteristics reveals the fact that a turn-on current flowing in the memory page 0 of the memory array is 1.5 to 2.3 times greater than that of the respective memory pages 6 and 14 of the memory array. The turn-on current refers to a drain current that flows while memory array is rendered conductive upon application of a gate potential above threshold voltage, which can be, for example, between +10V and +15V.

Electrical characteristics of the 3D NAND-flash memory array that comprises at least one assist gate structure can also be described with reference to FIG. 5B, which shows the relation of gate current (Id) versus drain voltage (Vg) of the memory array. In particular, graph 500B depicts the impact on cell performance of using poly crystalline silicon of grain size of 50 nm and interface trap density ($D_{it}$) of 1e13 $cm^{-2}ev^{-1}$ on cell performance. In other implementations, other device characteristics can be used such as channel lengths, channel widths, bit line voltage, program time, erase time, program-erase cycling, and conduction band.

In graph 500B, five Id-Vg characteristic curves are plotted: the solid line curve is that of memory page 0 of the memory array; the first dashed line curve is that of memory page 2 of the memory array; the second dashed line curve is that of memory page 6 of the memory array; the third dashed line curve is that of memory page 10 of the memory array; and the fourth dashed line curve is that of memory page 14 of the memory array. Comparing the five memory page characteristics reveals the fact that a turn-on current flowing in the memory page 0 of the memory array is 1 to 2 times greater than that of the respective memory pages 2, 6, 10, and 14 of the memory array.

Figure 5C:
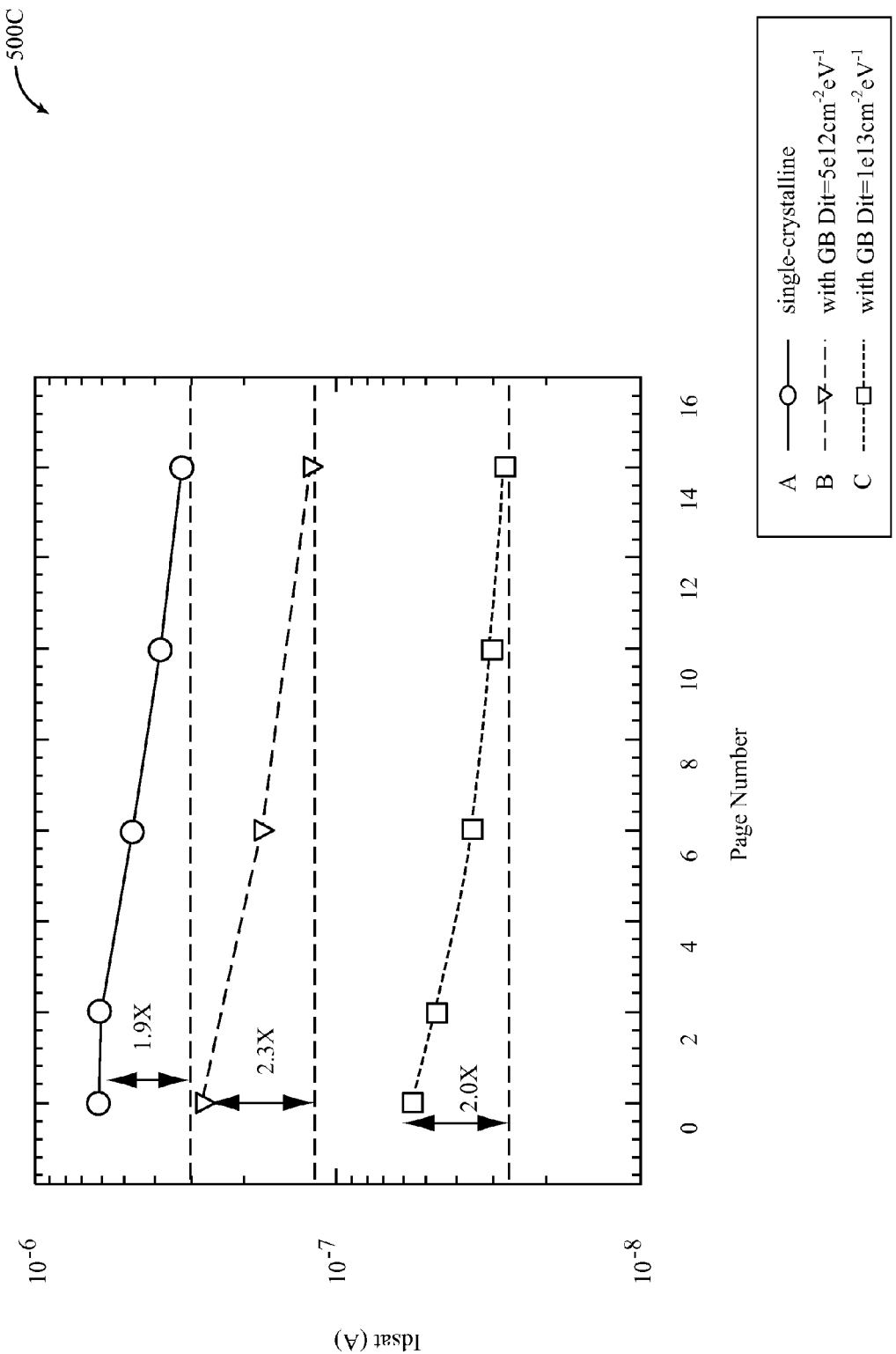
FIG. 5C is a graphical plot illustrating the saturated current ($Id_{sat}$) as a function of the memory pages for various crystalline silicon forms.

Three typical cases are shown to evaluate the impact of varying interface trap density and random grain boundary effect. Shown in FIG. 5C is a graphical plot 500C illustrating the saturated current ($Id_{sat}$) as a function of the memory pages for various crystalline silicon forms. In graph 500C, the solid curve A with circles represents $Id_{sat}$ discrepancy between memory pages 0 and 14 for a single crystalline silicon implementation of the 3D NAND-flash memory array. In this implementation, the crystal curve A is the simulated $Id_{sat}$-page number curve lacking a grain boundary in the channel. As shown in FIG. 5C, the $Id_{sat}$ in memory page 0 is 1.9 times than that of the memory page 14.

Curves B and C are simulated based on identical geometric parameters, except for the grain boundary and interface trap density conditions; however, they exhibit distinct cell characteristics, as described below.

The dashed curve B with inverted triangles represents $Id_{sat}$ discrepancy between memory pages 0 and 14 for a poly crystalline silicon implementation of the 3D NAND-flash memory array. In this implementation, the interface trap density ($D_{it}$) of the poly crystalline silicon is $5e12$ $cm^{-2}ev^{-1}$. Attention should also be paid to the fact that the $Id_{sat}$ in memory page 0 is 2.3 times that of the memory page 14.

Further, the dashed curve C with squares represents $Id_{sat}$ discrepancy between memory pages 0 and 14 for a poly crystalline silicon implementation of the 3D NAND-flash memory array. In this implementation, the interface trap density ($D_{it}$) of the poly crystalline silicon is $1e13$ $cm^{-2}ev^{-1}$. Attention should further be paid to the fact that the $Id_{sat}$ in memory page 0 is 2.0 times that of the memory page 14.

Figure 6A:
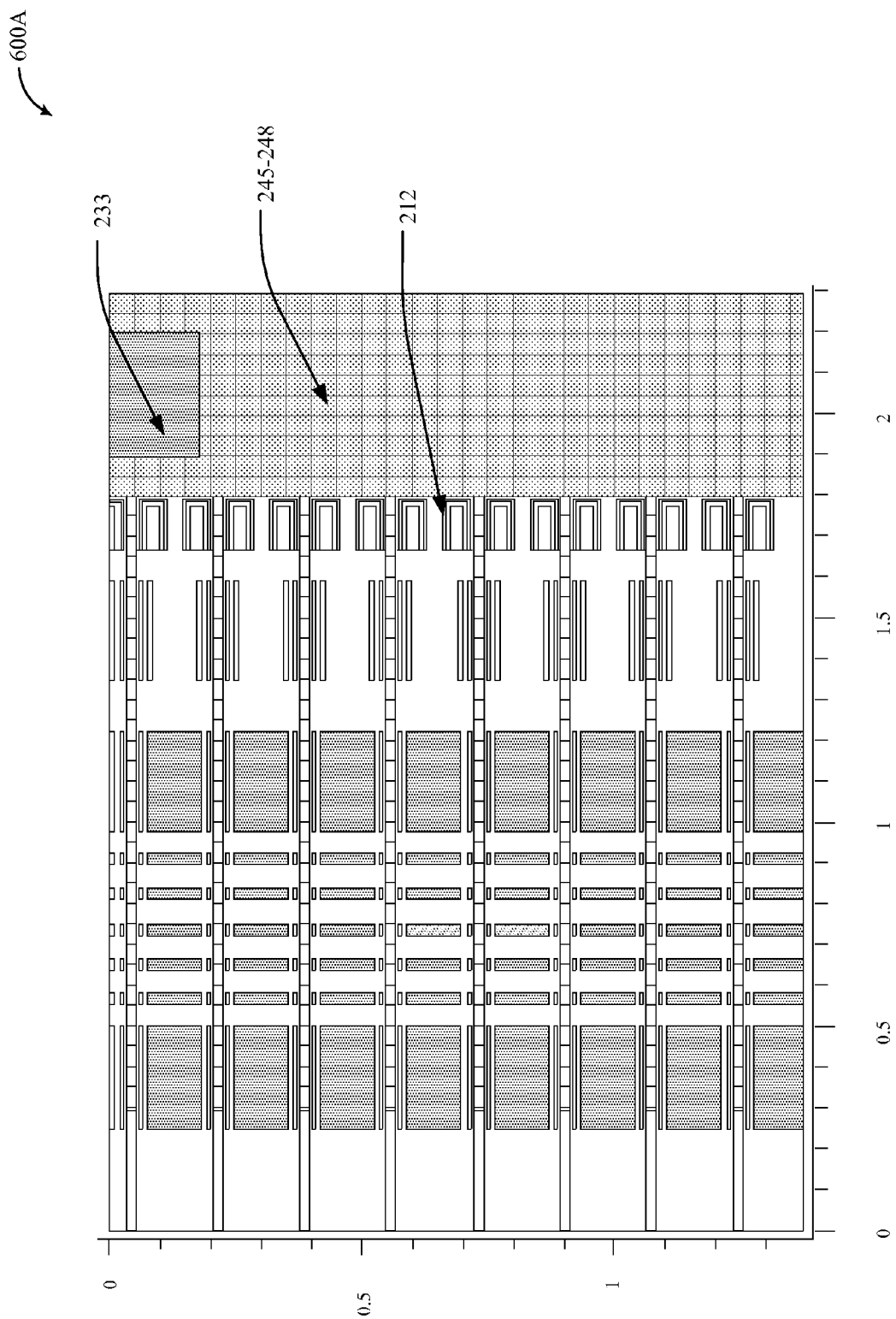
FIG. 6A is a schematic architecture of a 3D NAND-flash memory array including a semiconductor pad that is entirely and uniformly doped.

Thus, the $Id_{sat}$ discrepancy between memory pages 0 and 14 becomes higher when grain size effects are considered. Although, the discrepancy becomes smaller if interface trap density ($D_{it}$) is increased, according to other implementations FIGS. 6A-6F illustrate the impact of implanting impurities to the semiconductor pads of the of a 3D NAND-flash memory array that comprises at least one assist gate structure. In particular, FIG. 6A is a schematic layout 600A of the memory array including a semiconductor pad that is entirely and uniformly doped using tilt-angle array implantations. In particular, FIG. 6A is a 4-layer vertical gate, thin-film-transistor, BE-SONOS charge trapping NAND device that has been fabricated and tested. The device is made with a 75 nm half-pitch. The channels are about 43 nm 4 $F^2$ thick.

Also in FIG. 6A, the doping of the semiconductor pad is illustrated using visual hashing of the semiconductor pad 245. In this implementation, a center WL is selected to read. The grain boundary is generated randomly with limited grain size and angle. Like reference numerals are utilized in this figure, and not described again. Simulation 600A can be performed using TCAD.

Figure 6B:
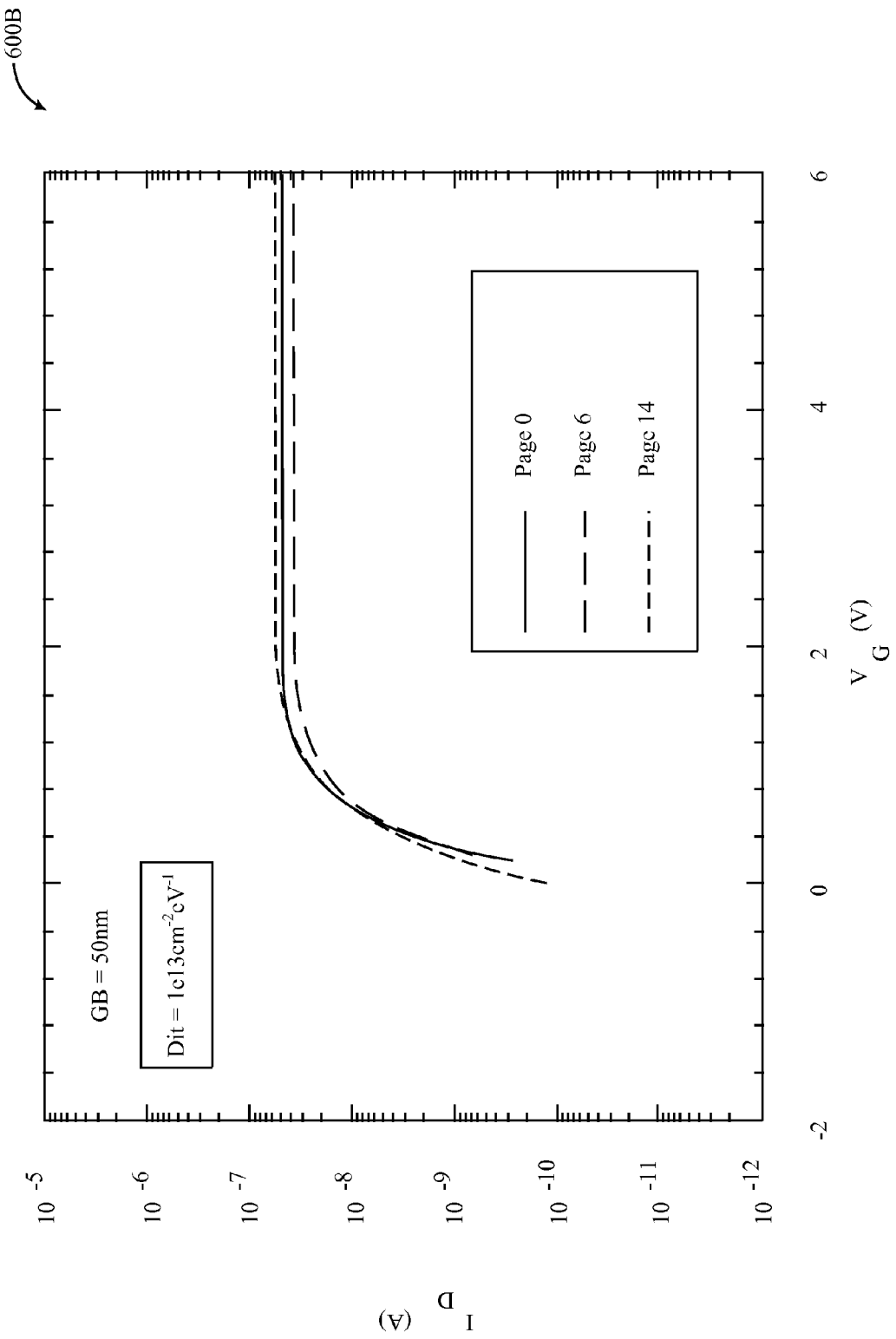
FIGS. 6B-6D illustrate the impact of doping the semiconductor pads of a 3D NAND-flash memory array that comprises at least one assist gate structure.
Figure 6C:
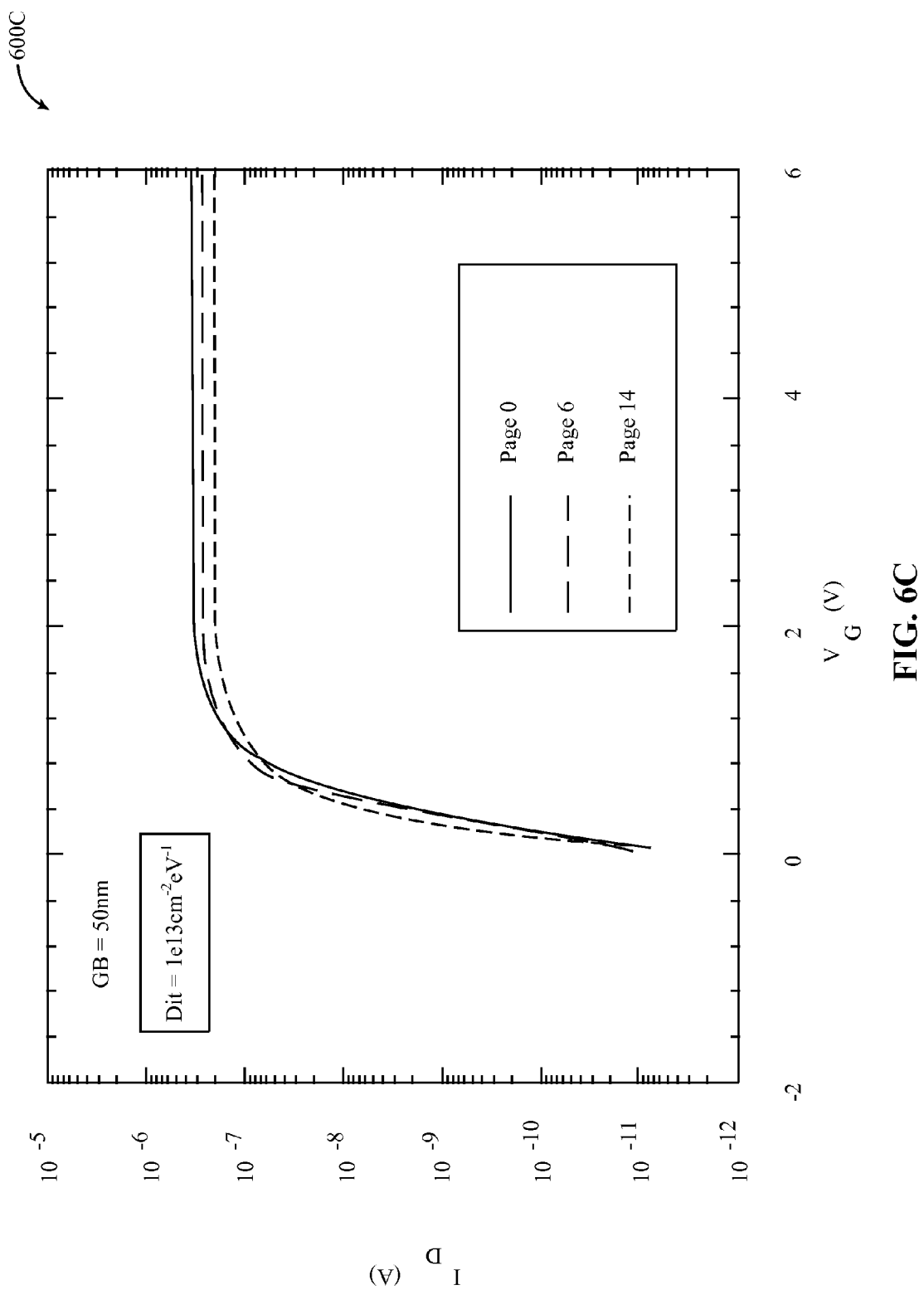
Figure 6D:
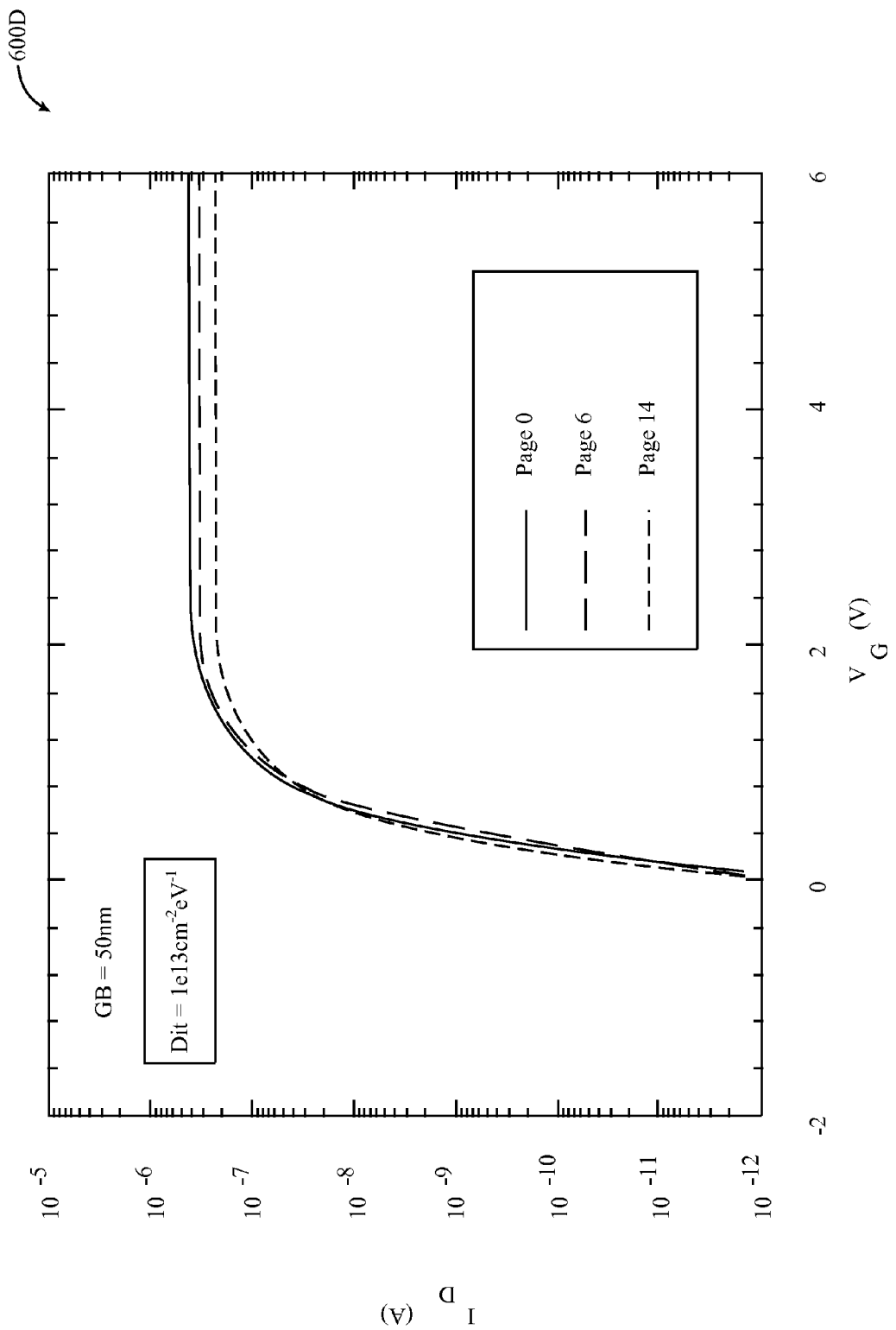

With reference to FIGS. 6B-6D, three Id-Vg graphs 600B, 600C, and 600D are shown. Since all the other geometric conditions are fixed, the variations in Id-Vg curves are attributed to the different doping concentrations.

Electrical characteristics of the 3D NAND-flash memory array that comprises at least one assist gate structure can be described with reference to FIG. 6B, which shows the relation of gate current (Id) versus drain voltage (Vg) of the memory array. In particular, graph 600B depicts the impact of doping the semiconductor pad with ion concentration of $1e17$ $cm^{-3}$.

The grain size of the crystalline silicon is 50 nm and the interface trap density ($D_{it}$) is $1e13$ $cm^{-2}ev^{-1}$. In other implementations, other device characteristics can be used such as channel lengths, channel widths, bit line voltage, program time, erase time, program-erase cycling, and conduction band.

In graph 600B, three Id-Vg characteristic curves are plotted: the solid line curve is that of memory page 0 of the memory array; the first dashed line curve is that of memory page 6 of the memory array; and the second dashed line curve is that of memory page 14 of the memory array. Comparing the three memory page characteristics reveals the fact that a turn-on current flowing in the memory page 0 of the memory array is 0.1 to 0.7 times greater than that of the respective memory pages 6 and 14 of the memory array.

Electrical characteristics of the 3D NAND-flash memory array that comprises at least one assist gate structure can also be described with reference to FIG. 6C, which shows the relation of gate current (Id) versus drain voltage (Vg) of the memory array. In particular, graph 600C depicts the impact of doping the semiconductor pad with ion concentration of $5e17$ $cm^{-3}$. The grain size of the crystalline silicon is 50 nm and the interface trap density ($D_{it}$) is $1e13$ $cm^{-2}ev^{-1}$. In other implementations, other device characteristics can be used such as channel lengths, channel widths, bit line voltage, program time, erase time, program-erase cycling, and conduction band.

In graph 600C, three Id-Vg characteristic curves are plotted: the solid line curve is that of memory page 0 of the memory array; the first dashed line curve is that of memory page 6 of the memory array; and the second dashed line curve is that of memory page 14 of the memory array. Comparing the three memory page characteristics reveals the fact that a turn-on current flowing in the memory page 0 of the memory array is 0.1 to 0.2 times greater than that of the respective memory pages 6 and 14 of the memory array.

Electrical characteristics of the 3D NAND-flash memory array that comprises at least one assist gate structure can further be described with reference to FIG. 6D, which shows the relation of gate current (Id) versus drain voltage (Vg) of the memory array. In particular, graph 600D depicts the impact of doping the semiconductor pad with ion concentration of $1e18$ $cm^{-3}$. The grain size of the crystalline silicon is 50 nm and the interface trap density ($D_{it}$) is $1e13$ $cm^{-2}ev^{-1}$. In other implementations, other device characteristics can be used such as channel lengths, channel widths, bit line voltage, program time, erase time, program-erase cycling, and conduction band.

In graph 600D, three Id-Vg characteristic curves are plotted: the solid line curve is that of memory page 0 of the memory array; the first dashed line curve is that of memory page 6 of the memory array; and the second dashed line curve is that of memory page 14 of the memory array. Comparing the three memory page characteristics reveals the fact that a turn-on current flowing in the memory page 0 of the memory array is 0.1 to 0.4 times greater than that of the respective memory pages 6 and 14 of the memory array.

Figure 6E:
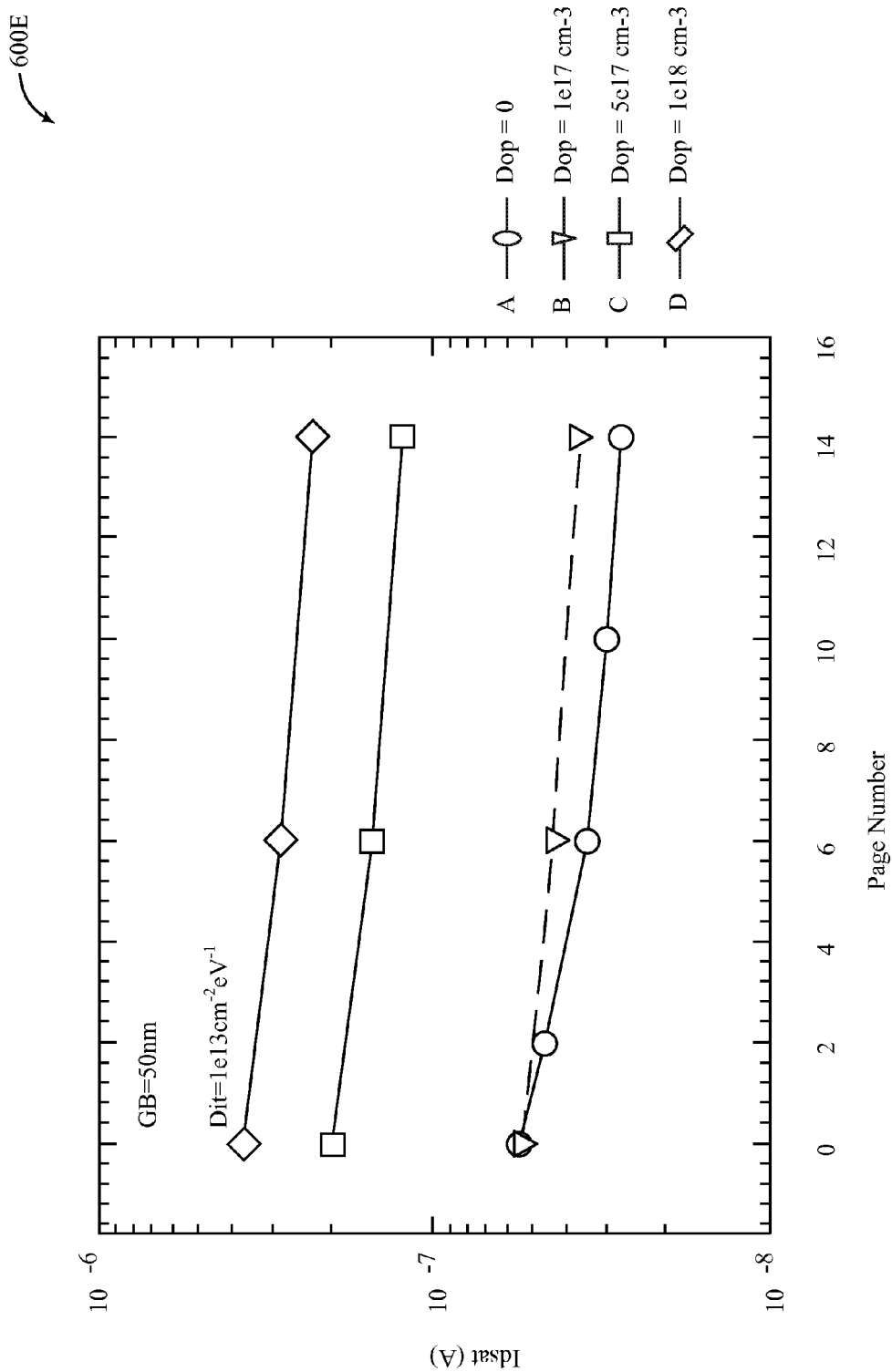
FIG. 6E is a graphical plot illustrating saturated current ($Id_{sat}$) as a function of memory pages for various crystalline silicon with different doping concentrations.

Four cases are shown to evaluate the impact of the varying doping concentrations. Shown in FIG. 6E is a graphical plot 600E illustrating the saturated current ($Id_{sat}$) as a function of the memory pages for various crystalline silicon with different doping concentrations. In graph 600E, the solid curve A with circles represents $Id_{sat}$ discrepancy between memory pages 0 and 14 for a crystalline silicon implementation of the 3D NAND-flash memory array with no doping in the semiconductor pads.

Curves B, C, and D are simulated based on identical geometric parameters, except for the doping concentrations; however, they exhibit distinct cell characteristics, as described below.

The dashed curve B with inverted triangles represents $Id_{sat}$ discrepancy between memory pages 0 and 14 for a crystalline silicon implementation of the 3D NAND-flash memory array. In this implementation, the semiconductor pad is doped with ion concentration of 1e17 $cm^{-3}$.

Also, the dashed curve C with squares represents $Id_{sat}$ discrepancy between memory pages 0 and 14 for a crystalline silicon implementation of the 3D NAND-flash memory array. In this implementation, the semiconductor pad is doped with ion concentration of 5e17 $cm^{-3}$.

Further, the dashed curve D with rhombuses represents $Id_{sat}$ discrepancy between memory pages 0 and 14 for a crystalline silicon implementation of the 3D NAND-flash memory array. In this implementation, the semiconductor pad is doped with ion concentration of 1e18 $cm^{-3}$.

Figure 6F:
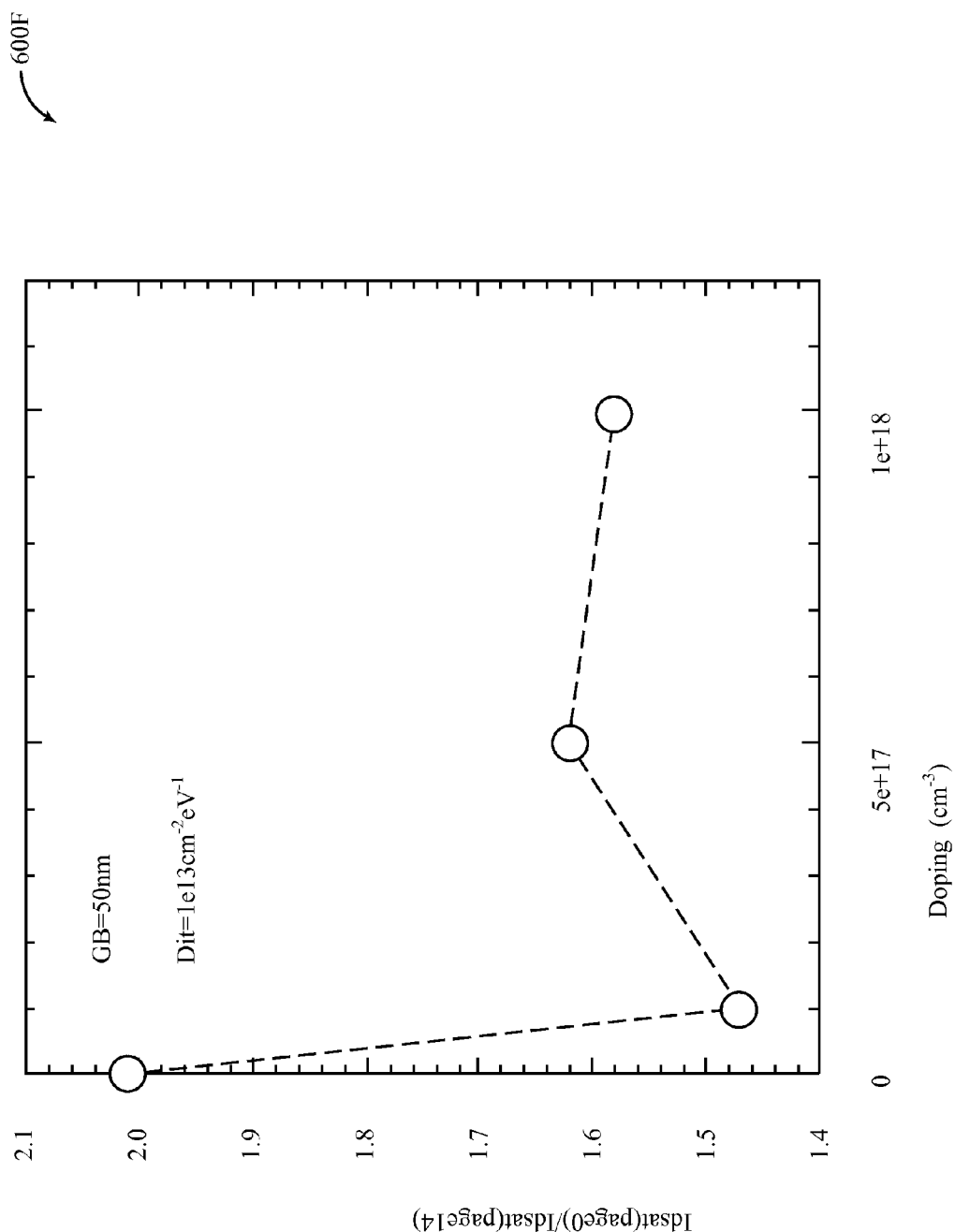
FIG. 6F is a graph depicting doping concentration versus the ratio of saturated current ($Id_{sat}$) of memory page 0 and saturated current ($Id_{sat}$) of memory page 14.

FIG. 6F is a graph 600F depicting the doping concentration versus the ratio of $Id_{sat}$ of memory page 0 and $Id_{sat}$ of memory page 14. The $Id_{sat}$ in memory page 0 is 2.0 times that of the memory page 14 when the doping concentration is zero. The $Id_{sat}$ in memory page 0 is 1.3 times that of the memory page 14 when the doping ion concentration is 1e17 $cm^{-3}$. Further, the $Id_{sat}$ in memory page 0 is 1.65 times that of the memory page 14 when the doping concentration is 5e17 $cm^{-3}$. In addition, the $Id_{sat}$ in memory page 0 is 1.59 times that of the memory page 14 when the doping concentration is 1e18 $cm^{-3}$.

Thus, the $Id_{sat}$ discrepancy between memory pages 0 and 14 becomes lower when the artificial implantation is adopted to lower the electrical resistance in the semiconductor pads.

The current flow path from the stack of semiconductor pads 245, 246, 247, and 248 to the semiconductor strips 221, 223, 225, and 227 is an uneven load due the stairstep structure of the stack of semiconductor pads 245, 246, 247, and 24. The variable flow increases when the number of memory pages increases from 16 to 32. The assist gate structure 212 solves this technical problem by creating an inversion channel in the region immediately between the assist gate structure 212 and the stack of semiconductor pads 245, 246, 247, and 248 and in the region in the stack of semiconductor pads 245, 246, 247, and 248 immediately adjacent to the assist gate structure 212. This inversion channel reduces the resistivity in the semiconductor strips 221, 223, 225, and 227 and thus improves the current flow path from the stack of semiconductor pads 245, 246, 247, and 248 to the semiconductor strips 221, 223, 225, and 227.

Figure 7A:
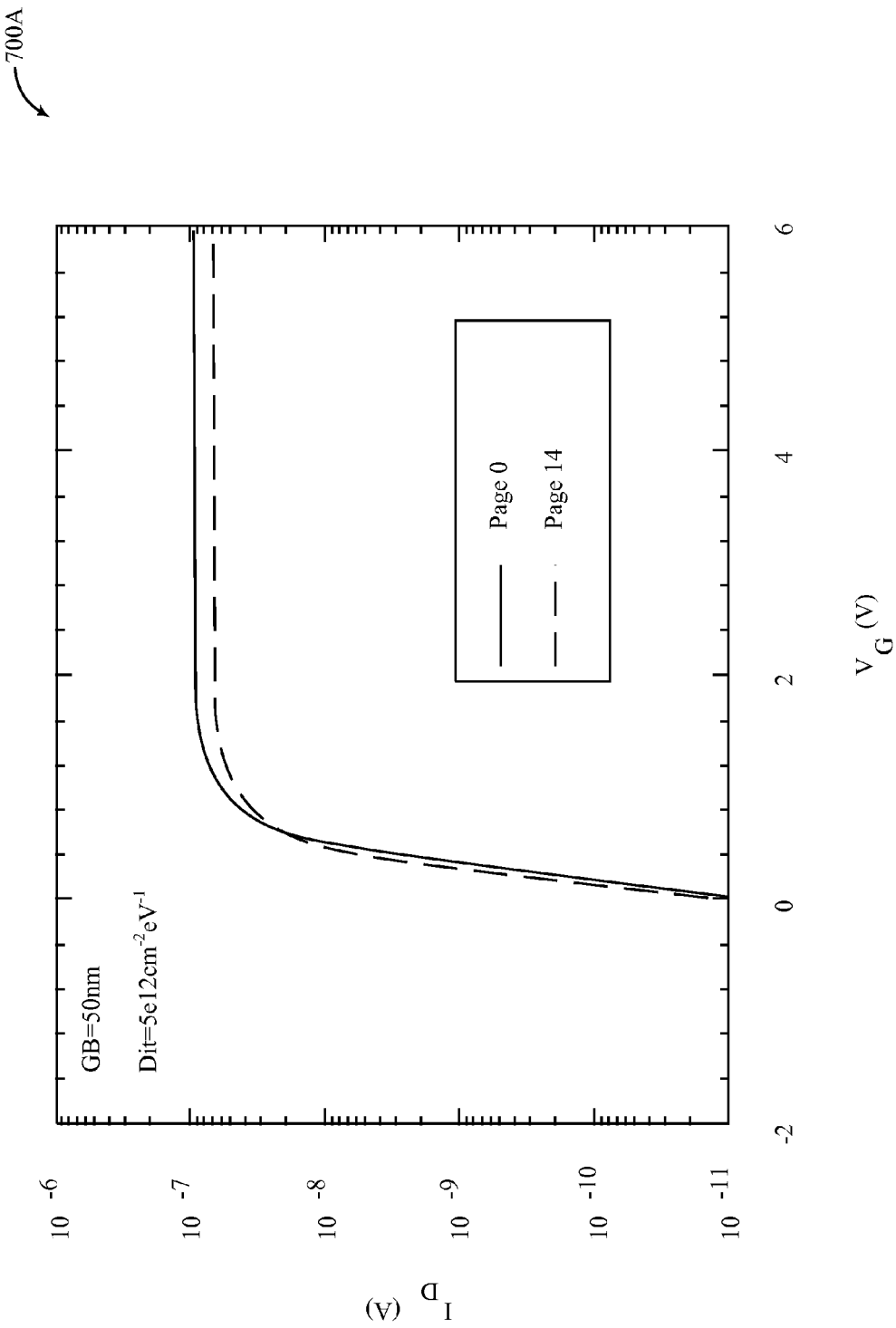
FIG. 7A describes electrical characteristics of a 64 WL (word line) 3D NAND-flash memory array that comprises at least one assist gate structure using Id-Vg characteristic curves.

FIG. 7A describes electrical characteristics of a 64 WL (word line) 3D NAND-flash memory array that comprises at least one assist gate structure using Id-Vg characteristic curves. In graph 700A, two Id-Vg characteristic curves are plotted: the solid line curve is that of memory page 0 of the memory array; and the dashed line curve is that of memory page 14 of the memory array. Comparing the two memory page characteristics reveals the fact that a turn-on current flowing in the memory page 0 of the memory array is 0.1 to 0.2 times greater than that of the respective memory pages 2, 6, 10, and 14 of the memory array. The turn-on current refers to a drain current that flows while memory array is rendered conductive upon application of a gate potential above threshold voltage, which can be, for example, between +10V and +15V.

Figure 7B:
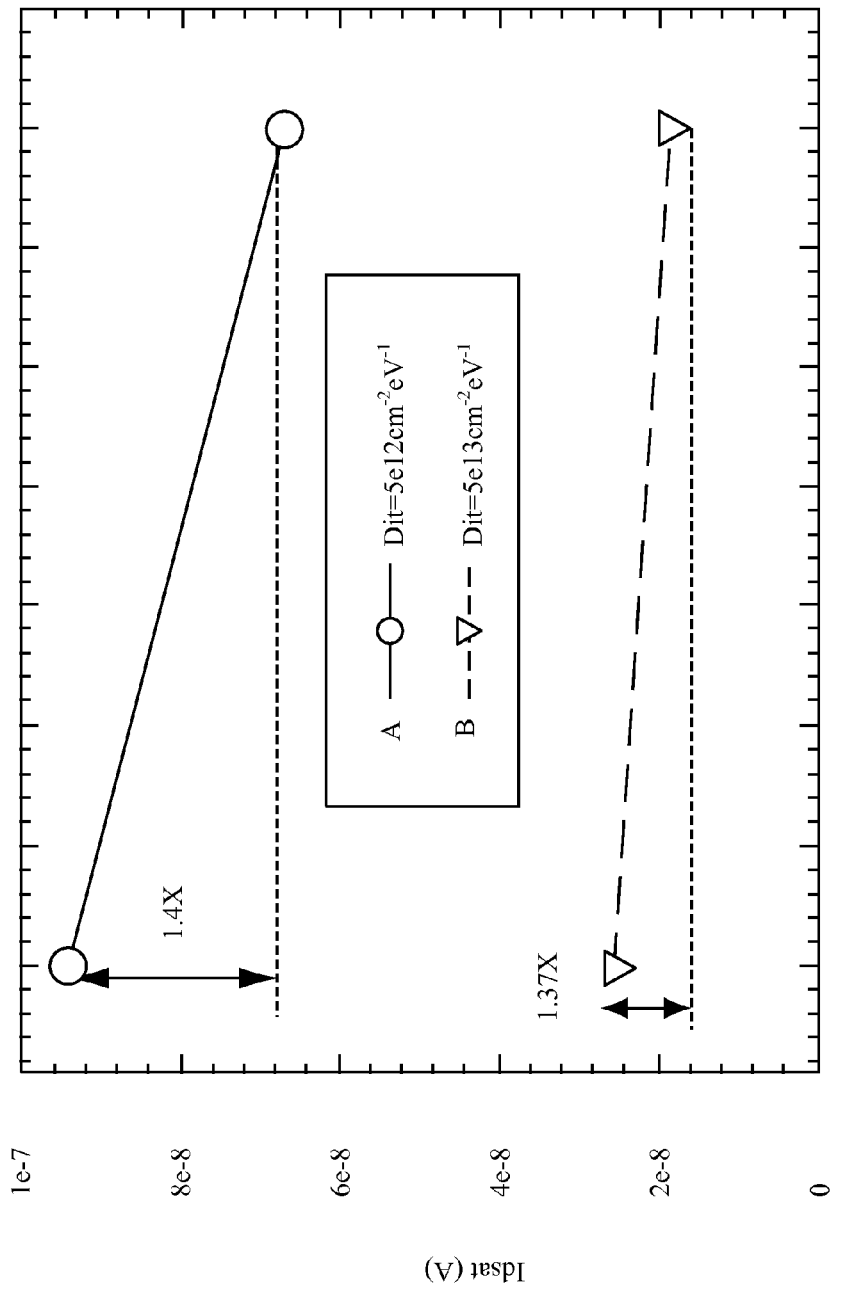
FIG. 7B is a graphical plot illustrating saturated current ($Id_{sat}$) as a function of memory pages for various interface trap densities of a 3D NAND-flash memory array that comprises 64 word lines (WLs) and at least one assist gate structure.

FIG. 7B is a graphical plot illustrating saturated current ($Id_{sat}$) as a function of memory pages for various interface trap densities of a 3D NAND-flash memory array that comprises 64 word lines (WLs) and at least one assist gate structure. Shown in FIG. 7B is a graphical plot 700B illustrating the saturated current ($Id_{sat}$) as a function of the memory pages for various interface trap densities. In graph 700B, the solid curve A with circles represents $Id_{sat}$ discrepancy between memory pages 0 and 14 for a crystalline silicon implementation of the 3D NAND-flash memory array with interface trap density ($D_{it}$) of 5e12 $cm^{-2}ev^{-1}$. The fact that the $Id_{sat}$ in memory page 0 is 1.40 times greater than that of the memory page 14.

The dashed curve B with inverted triangles represents $Id_{sat}$ discrepancy between memory pages 0 and 14 for a crystalline silicon implementation of the 3D NAND-flash memory array with interface trap density ($D_{it}$) of 5e12 $cm^{-2}ev^{-1}$. Attention should also be paid to the fact that the $Id_{sat}$ in memory page 0 is 1.37 times greater that of the memory page 14.

Thus, the saturated current ($Id_{sat}$) discrepancy is relatively independent of the interface trap density for a 3D NAND-flash memory array with 64 word lines (WLs).

With reference to FIGS. 8A-8D, four Id-Vg graphs 800A, 800B, 800C, and 800D are shown. Since all the other geometric conditions are fixed, the variation in Id-Vg curves are attributed to the differing offset distances between the assist gate structure 212 and the landing area 233 illustrated in FIG. 4A.

Figure 8A:
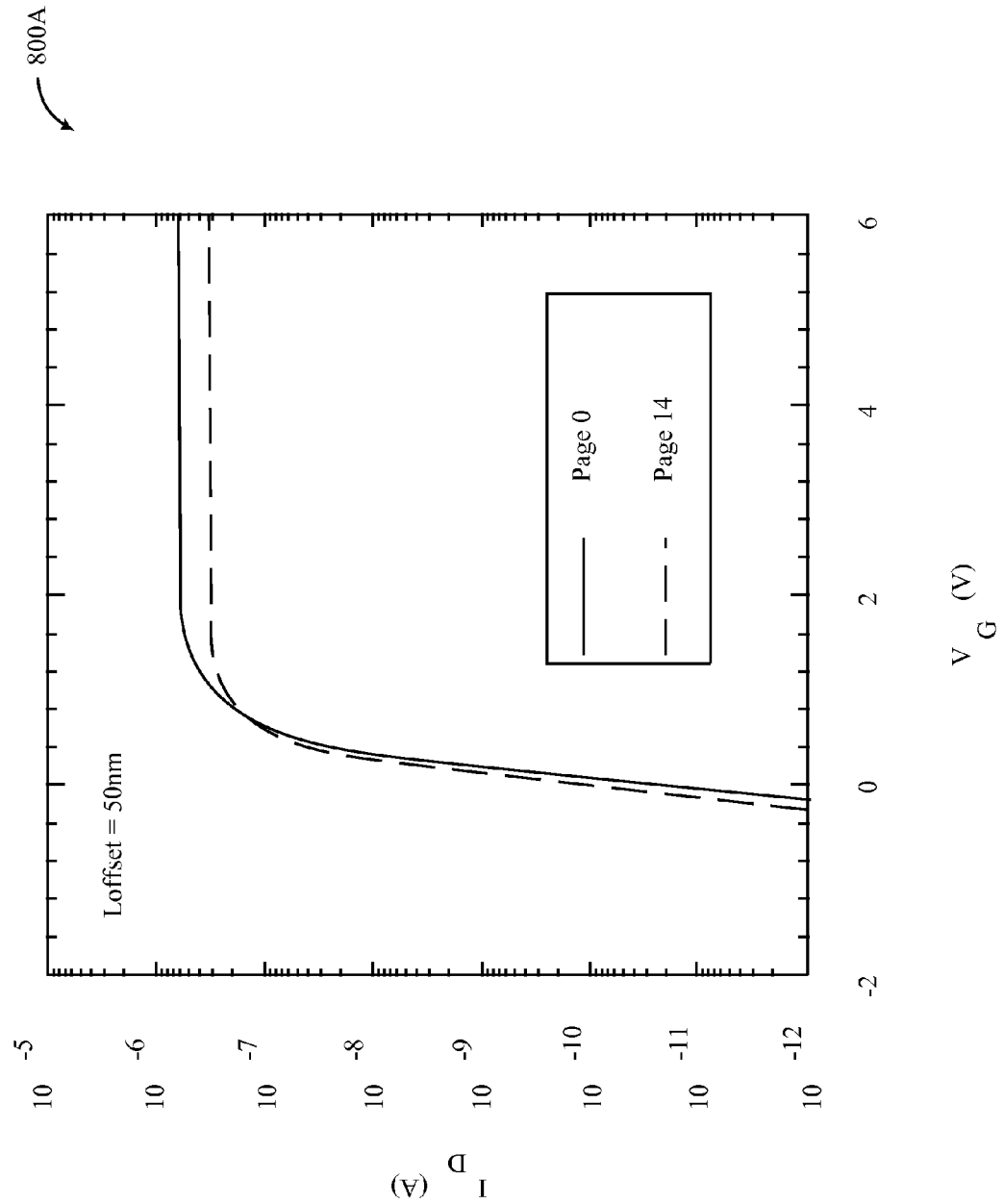
FIGS. 8A-8D illustrate the impact of differing offset distances between an assist gate structure and a landing area of a 3D NAND-flash memory array.

Electrical characteristics of the 3D NAND-flash memory array that comprises at least one assist gate structure can be described with reference to FIG. 8A, which shows the relation of gate current (Id) versus drain voltage (Vg) of the memory array. In particular, graph 800A depicts the impact offset distance between the assist gate structure 212 and the landing area 233. In the implementation shown in 800A, the offset distance is 50 nm. In other implementations, other device characteristics can be used such as channel lengths, channel widths, bit line voltage, program time, erase time, program-erase cycling, and conduction band.

In graph 800A, two Id-Vg characteristic curves are plotted: the solid line curve is that of memory page 0 of the memory array; and the dashed line curve is that of memory page 14 of the memory array. Comparing the three memory page characteristics reveals the fact that a turn-on current flowing in the memory page 0 of the memory array is 0.1 to 0.8 times greater than that of the memory page 14 of the memory array. The turn-on current refers to a drain current that flows while memory array is rendered conductive upon application of a gate potential above threshold voltage, which can be, for example, between +10V and +15V.

Figure 8B:
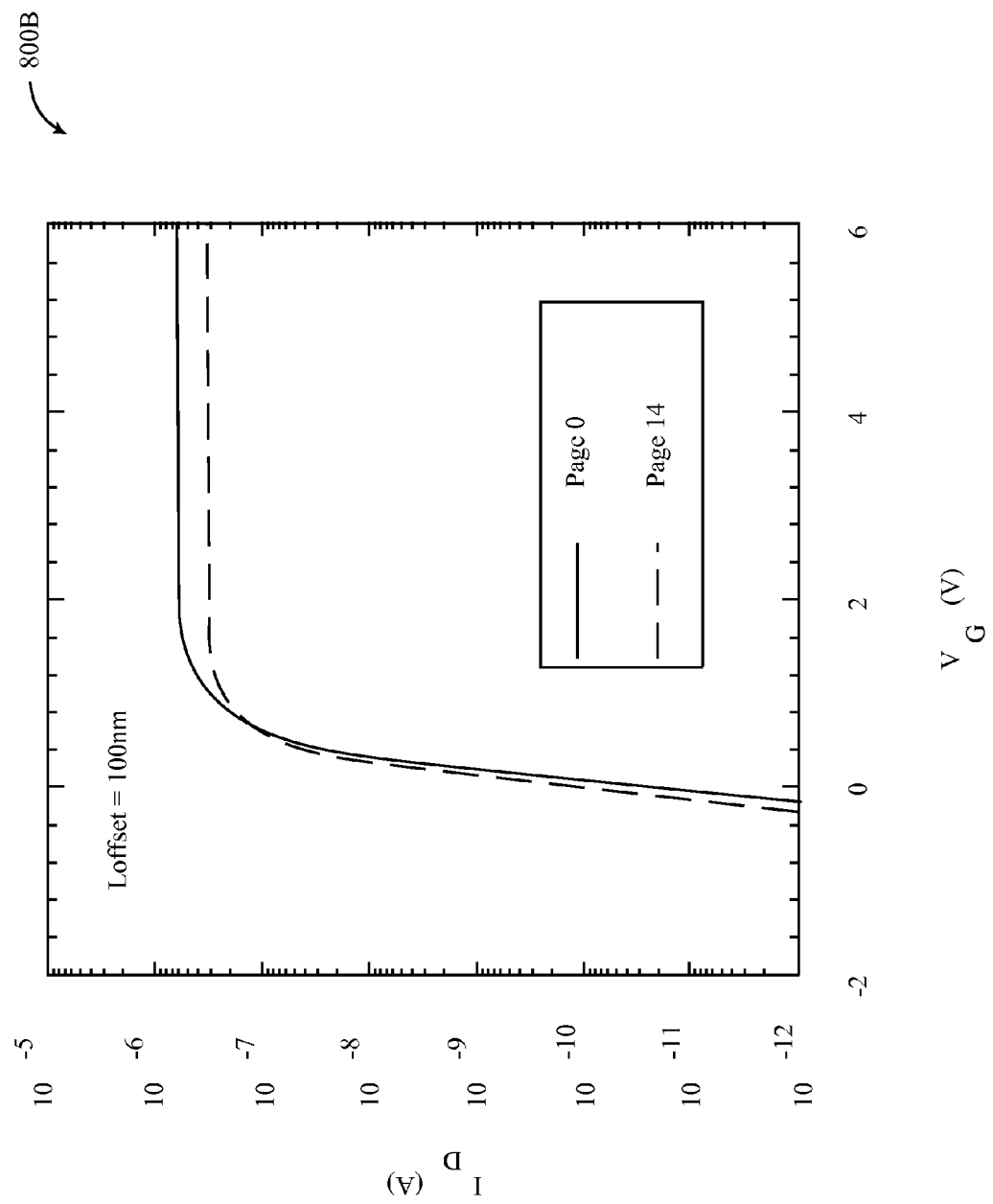

Electrical characteristics of the 3D NAND-flash memory array that comprises at least one assist gate structure can be described with reference to FIG. 8B, which shows the relation of gate current (Id) versus drain voltage (Vg) of the memory array. In particular, graph 800B depicts the impact of the offset distance between the assist gate structure 212 and the landing area 233. In the implementation shown in 800B, the offset distance is 100 nm. In other implementations, other device characteristics can be used such as channel lengths, channel widths, bit line voltage, program time, erase time, program-erase cycling, and conduction band.

In graph 800B, two Id-Vg characteristic curves are plotted: the solid line curve is that of memory page 0 of the memory array; and the dashed line curve is that of memory page 14 of the memory array. Comparing the three memory page characteristics reveals the fact that a turn-on current flowing in the memory page 0 of the memory array is greater by 0.1 to 0.6 orders of magnitude than that of the memory page 14 of the memory array. The turn-on current refers to a drain current that flows while memory array is rendered conductive upon application of a gate potential of 0 to 6 volts as shown in FIG. 8B.

Figure 8C:
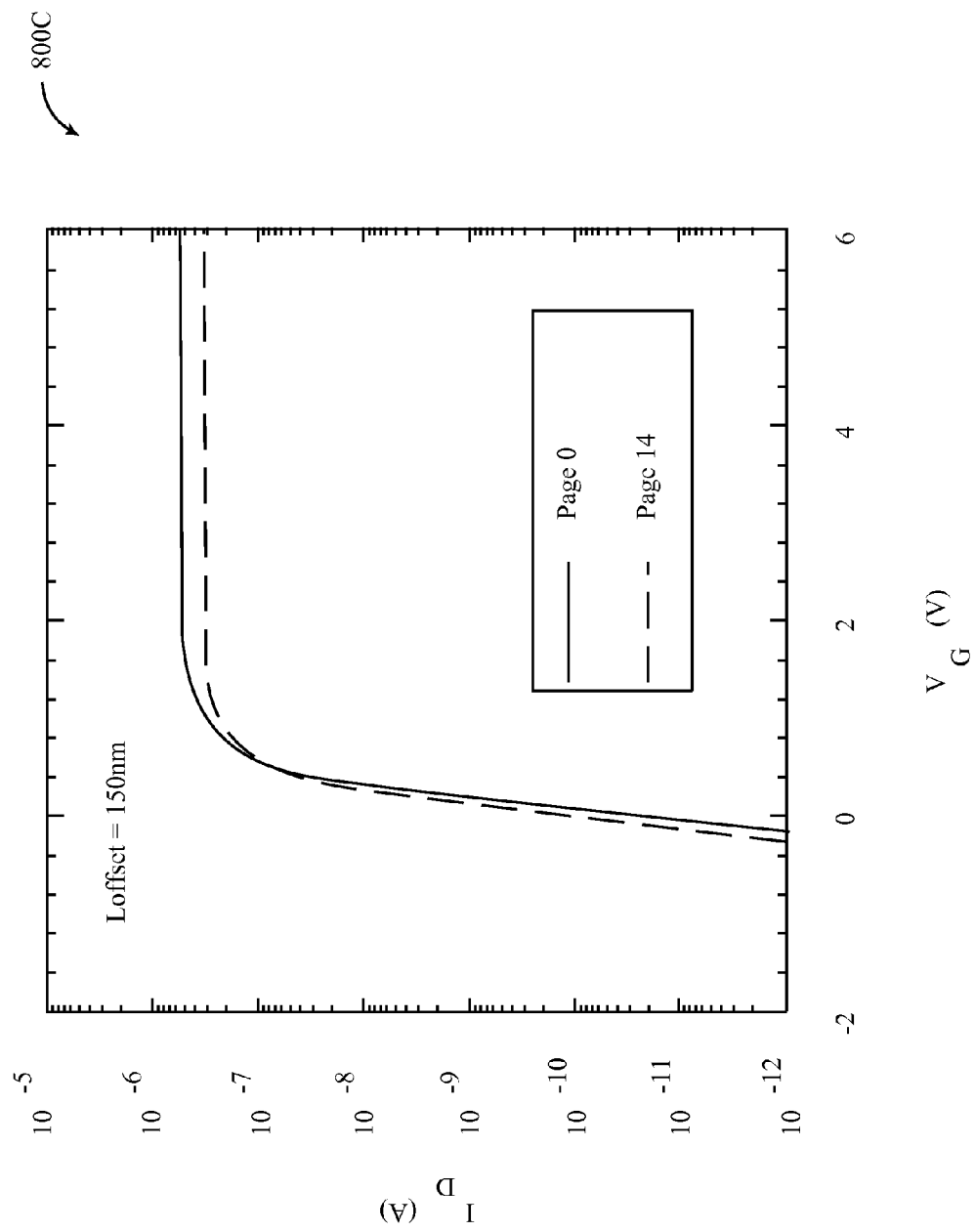

Electrical characteristics of the 3D NAND-flash memory array that comprises at least one assist gate structure can be described with reference to FIG. 8C, which shows the relation of gate current (Id) versus drain voltage (Vg) of the memory array. In particular, graph 800C depicts the impact of the offset distance between the assist gate structure 212 and the landing area 233. In the implementation shown in 800C, the offset distance is 150 nm. In other implementations, other device characteristics can be used such as channel lengths, channel widths, bit line voltage, program time, erase time, program-erase cycling, and conduction band.

In graph 800C, two Id-Vg characteristic curves are plotted: the solid line curve is that of memory page 0 of the memory array; and the dashed line curve is that of memory page 14 of the memory array. Comparing the three memory page characteristics reveals the fact that a turn-on current flowing in the memory page 0 of the memory array is greater by 0.1 to 0.4 orders of magnitude than that of the memory page 14 of the memory array. The turn-on current refers to a drain current that flows while memory array is rendered conductive upon application of a gate potential of 0 to 6 volts as shown in FIG. 8C.

Figure 8D:
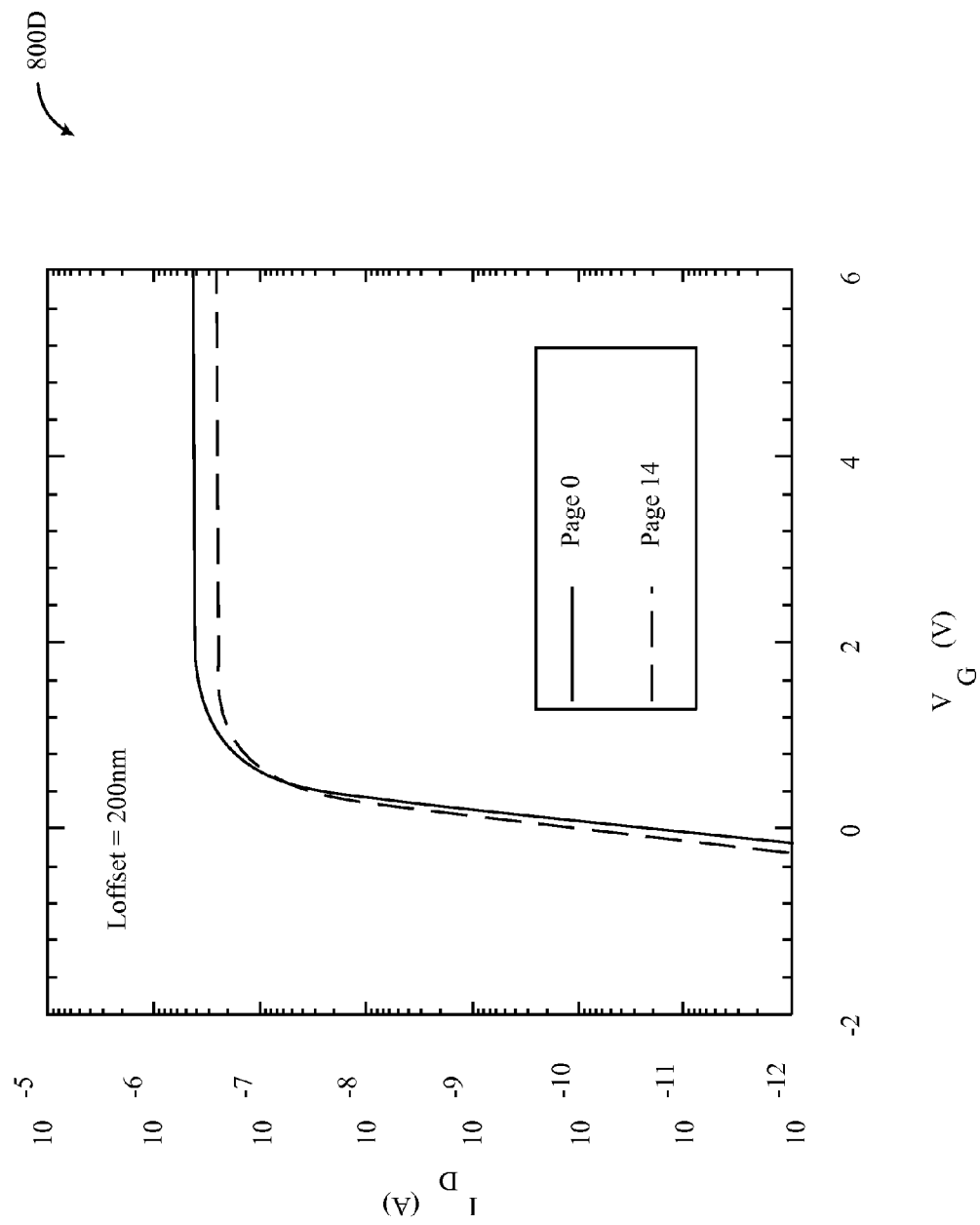

Electrical characteristics of the 3D NAND-flash memory array that comprises at least one assist gate structure can be described with reference to FIG. 8D, which shows the relation of gate current (Id) versus drain voltage (Vg) of the memory array. In particular, graph 800D depicts the impact offset distance between the assist gate structure 212 and the landing area 233. In the implementation shown in 800D, the offset distance is 200 nm. In other implementations, other device characteristics can be used such as channel lengths, channel widths, bit line voltage, program time, erase time, program-erase cycling, and conduction band.

In graph 800D, two Id-Vg characteristic curves are plotted: the solid line curve is that of memory page 0 of the memory array; and the dashed line curve is that of memory page 14 of the memory array. Comparing the three memory page characteristics reveals the fact that a turn-on current flowing in the memory page 0 of the memory array is greater by 0.1 to 0.2 orders of magnitude than that of the memory page 14 of the memory array. The turn-on current refers to a drain current that flows while memory array is rendered conductive upon application of a gate potential of 0 to 6 volts as shown in FIG. 8D.

Curves A and B are simulated based on identical geometric parameters, except for the memory page numbers; however, they exhibit distinct cell characteristics, as described below.

Figure 8E:
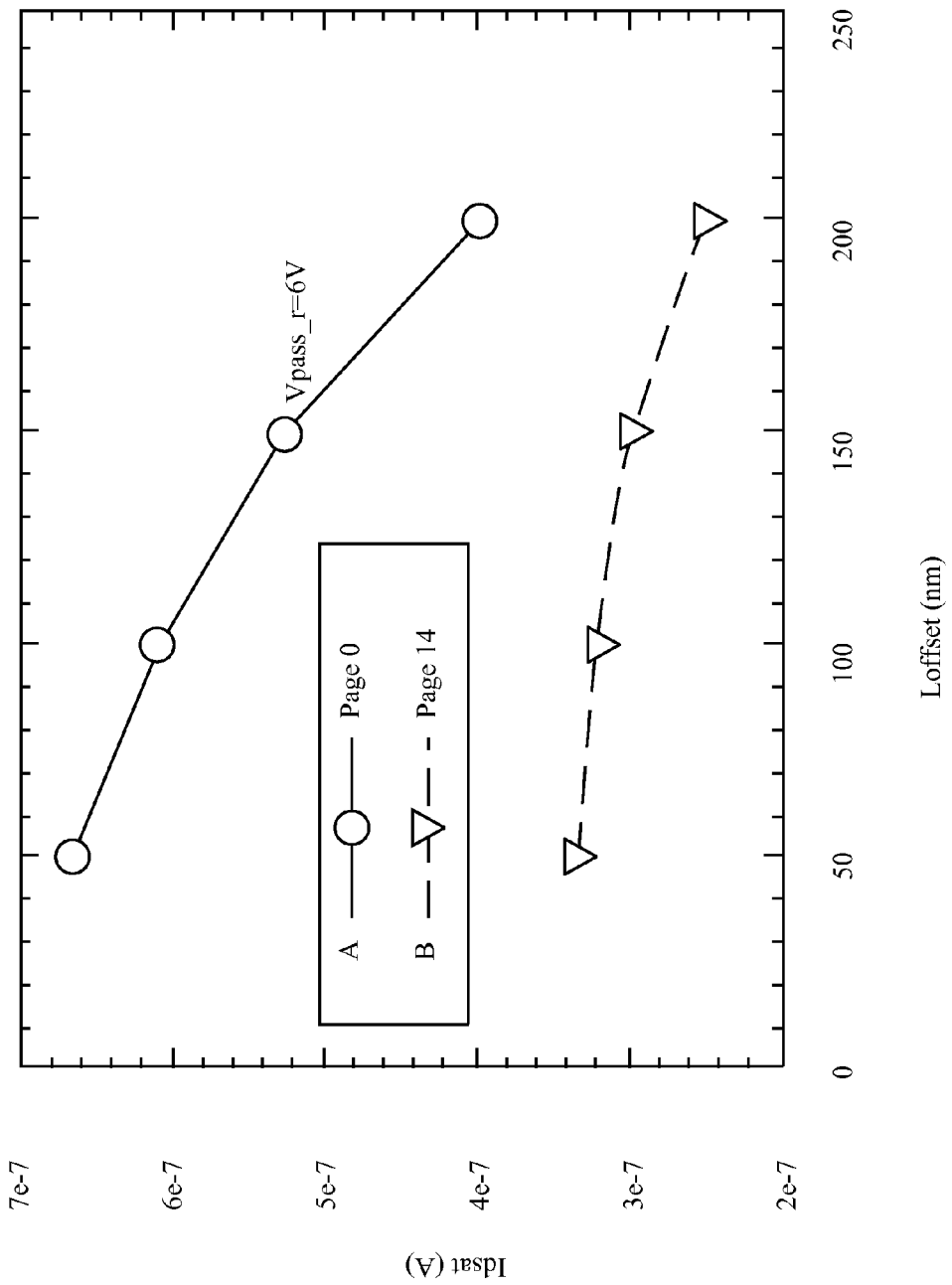
FIG. 8E is a graphical plot illustrating saturated current ($Id_{sat}$) as a function of offset distance for various memory pages of a 3D NAND-flash memory array that comprises at least one assist gate structure.

Shown in FIG. 8E is a graphical plot 800E illustrating the saturated current ($Id_{sat}$) as a function of the offset distance for various memory pages of the memory array. In graph 800E, the solid curve A with circles represents $Id_{sat}$ for memory page 0 along the offset distances ranging from 50 to 200 nm with 50 unit intervals. The dashed curve B with inverted triangles represents $Id_{sat}$ for memory page 14 along the offset distances with the same ranges used for the solid curve A.

Thus, lengthening the offset distance "Loffset" can more efficiently lower $Id_{sat}$ of memory page 0 because it results in memory page 0 having a relatively larger string length compared to that of memory page 14. As a result, $Id_{sat}$ discrepancy between each memory page is reduced proportional to an increase in the Loffset, according to one implementation.

Figure 9A:
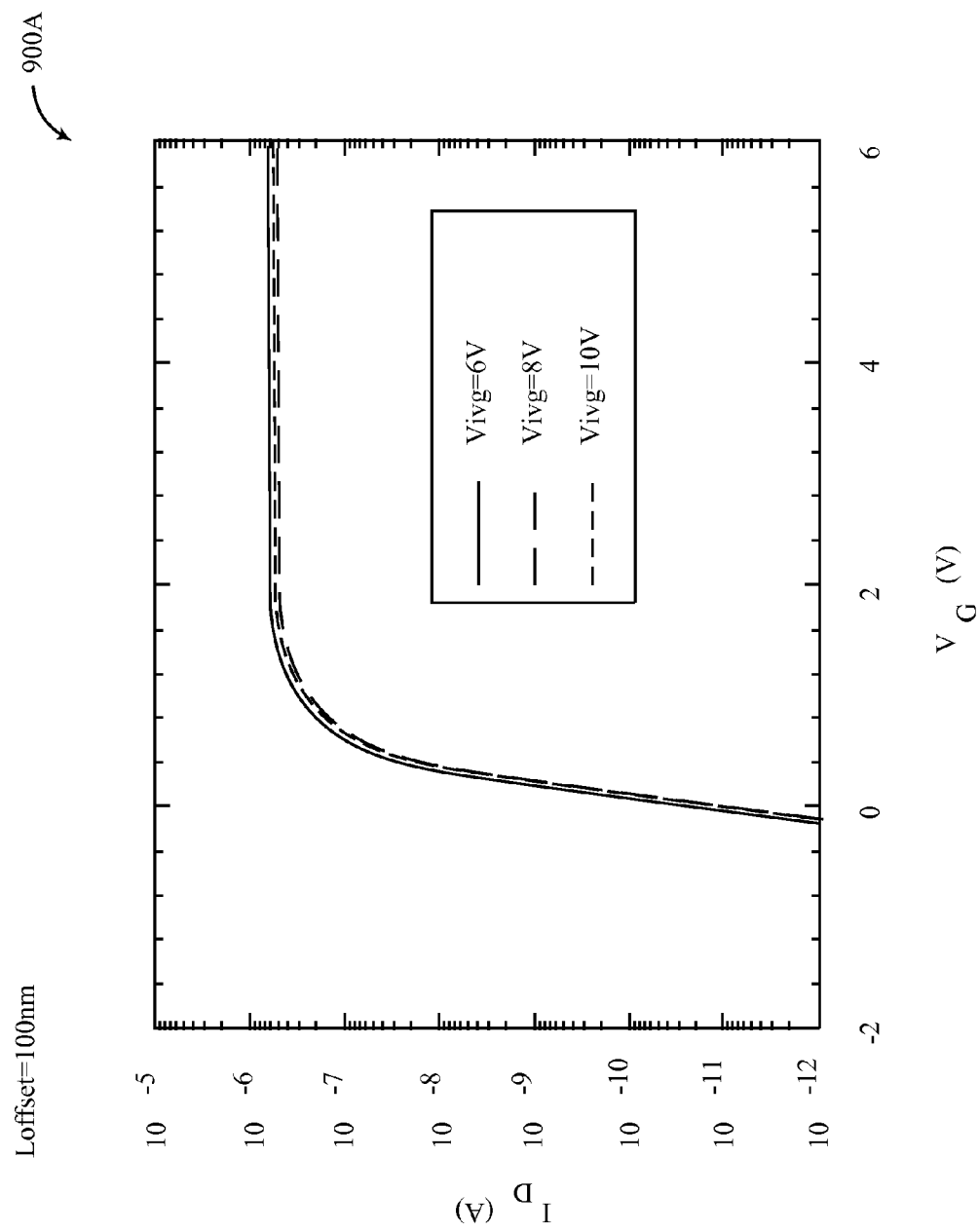
FIGS. 9A-B show Id-Vg characteristic curves for different assist gate structure biases of various memory pages of a 3D NAND-flash memory array that comprises at least one assist gate structure.
Figure 9B:
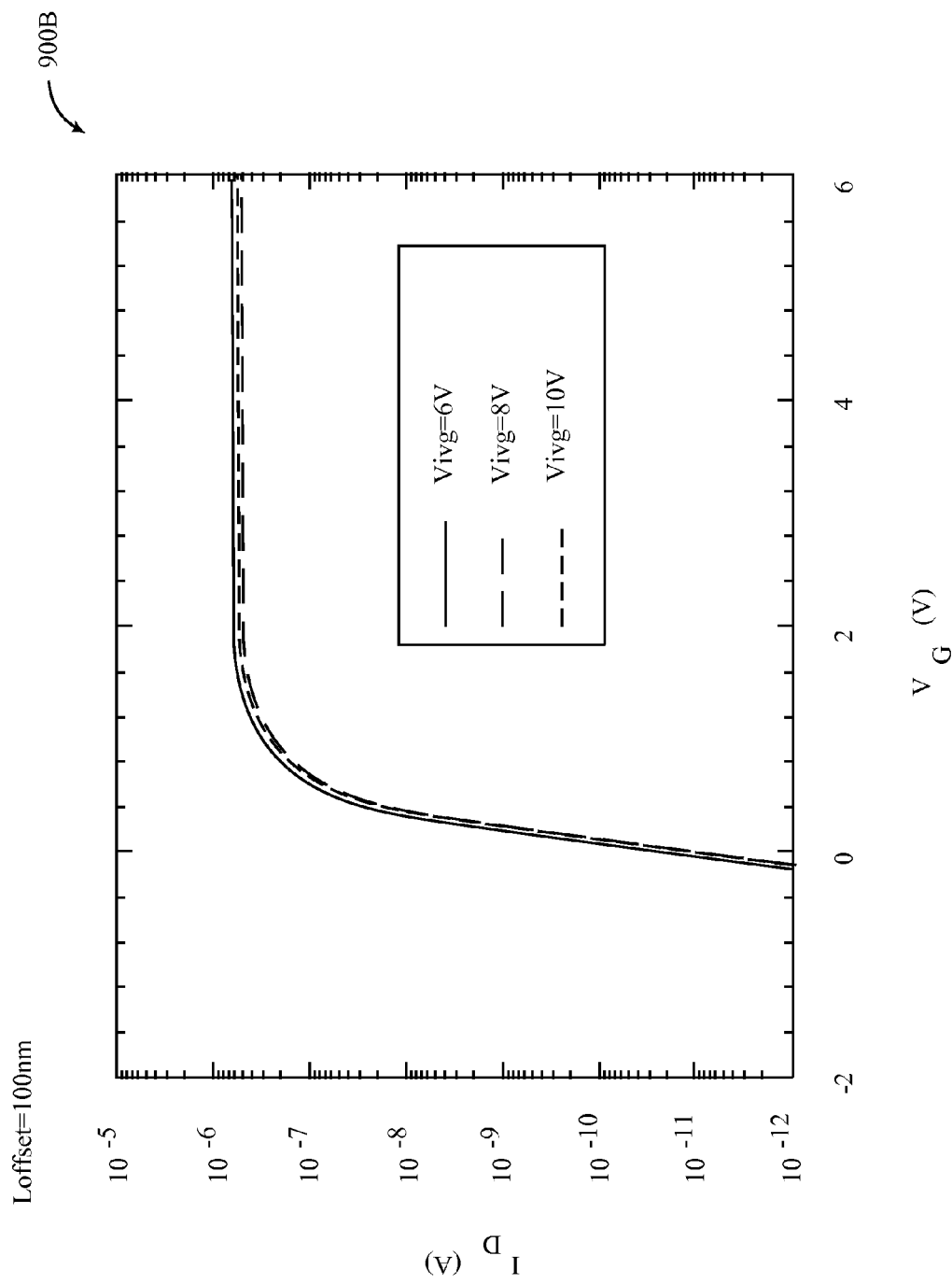

FIGS. 9A-B show Id-Vg characteristic curves 900A-B for different assist gate structure biases of various memory pages of a 3D NAND-flash memory array that comprises at least one assist gate structure. As shown in graph 900A, for page 0 of the 3D NAND-flash memory array, Id-Vg characteristics are determined for AG biases ranging from 6V, 8V, to 10V. As shown in graph 900B, for page 14 of the 3D NAND-flash memory array, Id-Vg characteristics are determined for AG biases ranging from 6V, 8V, to 10 V.

Figure 9C:
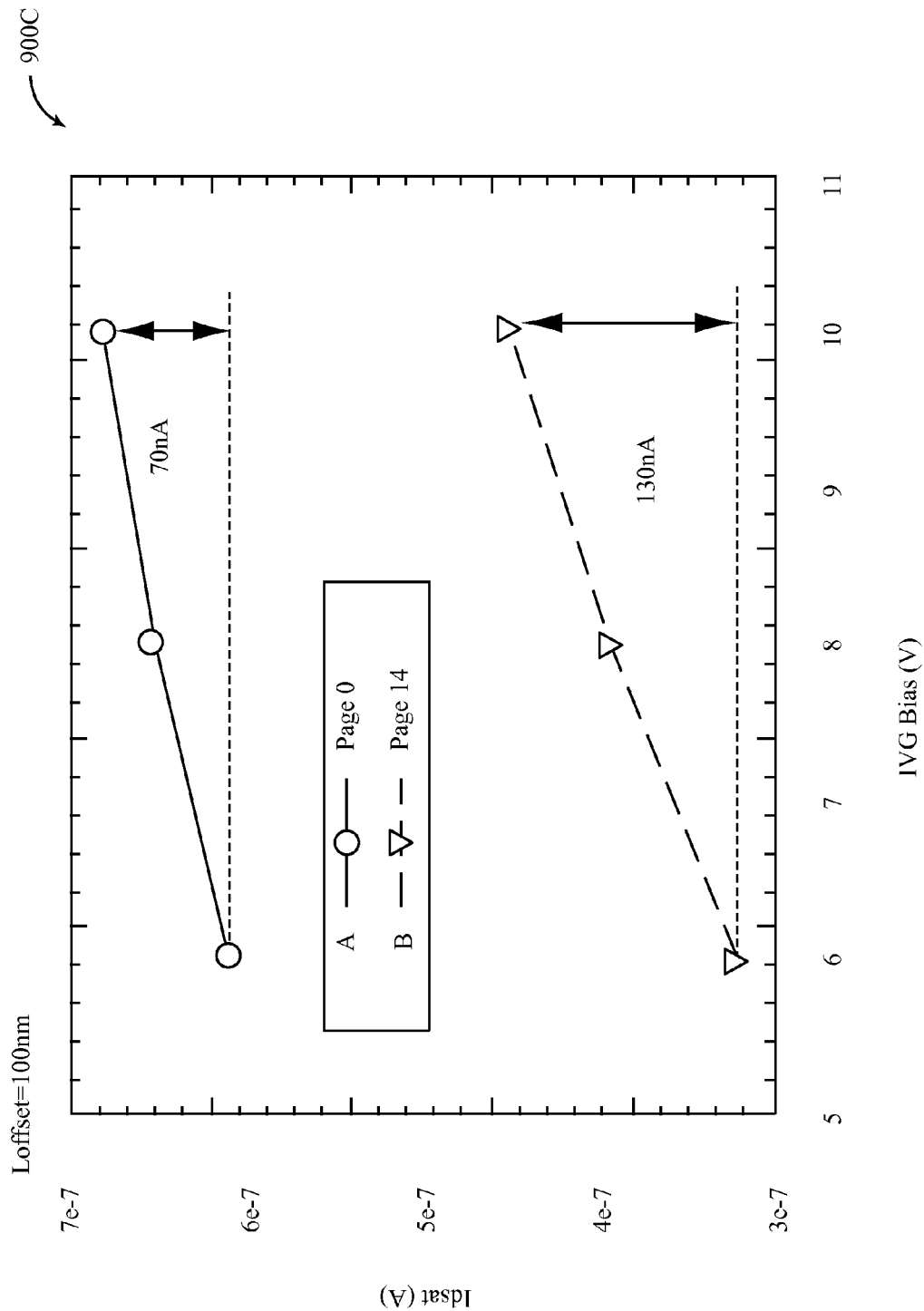
FIG. 9C is a graphical plot illustrating saturated current ($Id_{sat}$) as a function of AG biases for various memory pages of a 3D NAND-flash memory array that comprises at least one assist gate structure.

Shown in FIG. 9C is a graphical plot 900C illustrating the saturated current ($Id_{sat}$) as a function of the AG biases for various memory pages of the memory array. In graph 900C, the solid curve A with circles represents $Id_{sat}$ for memory page 0 along the AG biases ranging from 6V to 10 V with 2 unit intervals. The $Id_{sat}$ discrepancy between the upper AG bias and the lower AG bias in the range is 70 nA. The dashed curve B with inverted triangles represents $Id_{sat}$ for memory page 14 along the AG biases with the same ranges used for the solid curve A. The $Id_{sat}$ discrepancy between the upper AG bias and the lower AG bias in the range is 130 nA.

Thus, applying a larger AG bias serves to reduce the resistance of junction-free region in the semiconductor pad for memory page 14, while only the resistance of the inversion gate area is lowered by such a scheme for memory page 0. As a result, the $Id_{sat}$ of memory page 14 is greatly improved.

Figure 10:
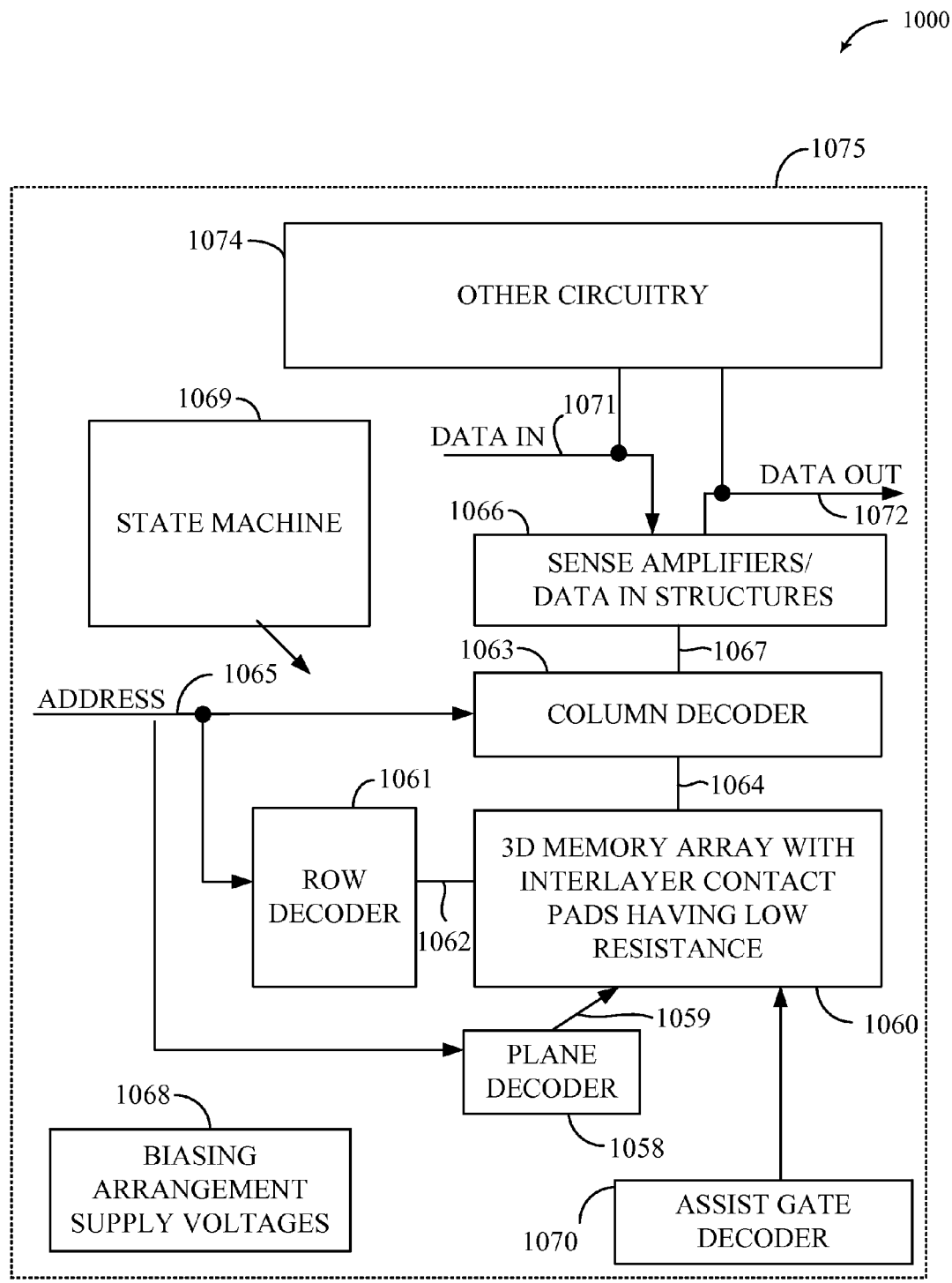
FIG. 10 is a simplified block diagram of an integrated circuit according to an implementation of the technology disclosed.

FIG. 10 is a simplified block diagram 1000 of an integrated circuit according to an implementation of the technology disclosed. The integrated circuit line 1075 includes a 3D NAND flash memory array 1060, having a structure like that of FIG. 2 for example, on a semiconductor substrate with lower resistance pads on each active layer. A row decoder 1061 is coupled to a plurality of word lines 1062, and arranged along rows in the memory array 1060. A column decoder 1063 is coupled to a plurality of SSL lines 1064 arranged along columns corresponding to stacks in the memory array 1060 for reading and programming data from the memory cells in the array 1060. A plane decoder 1058 is coupled to a plurality of planes in the memory array 1060 via bit lines 1059. Addresses are supplied on bus 1065 to column decoder 1063, row decoder 1061 and plane decoder 1058. Sense amplifiers and data-in structures in block 1066 are coupled to the column decoder 1063 in this example via data bus 1067. Data is supplied via the data-in line 1071 from input/output ports on the integrated circuit 1075 or from other data sources internal or external to the integrated circuit 1075, to the data-in structures in block 1066. In the illustrated implementation, other circuitry 1074 is included on the integrated circuit, such as a general purpose processor or special purpose application circuitry, or a combination of modules providing system-on-a-chip functionality supported by the NAND flash memory cell array. Data is supplied via the data-out line 1072 from the sense amplifiers in block 1066 to input/output ports on the integrated circuit 1075, or to other data destinations internal or external to the integrated circuit 1075.

A controller implemented in this example using bias arrangement state machine 1069 controls the application of bias arrangement supply voltage generated or provided through the voltage supply or supplies in block 1068, such as read, erase, program, erase verify and program verify voltages. The controller can be implemented using special-purpose logic circuitry as known in the art. In alternative implementations, the controller comprises a general-purpose processor, which may be implemented on the same integrated circuit, which executes a computer program to control the operations of the device. In yet other implementations, a combination of special-purpose logic circuitry and a general-purpose processor may be utilized for implementation of the controller.

Assist gate structure decoder 1070 is the bias circuitry and can be connected to the assist gate structure included in the 3D NAND flash memory array 1060. In one implementation, assist gate structure decoder 1070 applies a gate voltage in response to addresses selecting a memory cell in a block when the select gate structure is turned on. Applying a gate voltage to the assist gate structure can cause a local inversion channel (i.e. an increase in the concentration of charge carriers) to form in the semiconductor strips near the assist gate structure, and reduce resistivity in current paths from the semiconductor pads to the memory cells on the semiconductor strips.

The terms and expressions employed herein are used as terms and expressions of description and not of limitation, and there is no intention, in the use of such terms and expressions, of excluding any equivalents of the features shown and described or portions thereof. In addition, having described certain implementations of the technology disclosed, it will be apparent to those of ordinary skill in the art that other implementations incorporating the concepts disclosed herein can be used without departing from the spirit and scope of the technology disclosed. Accordingly, the described implementations are to be considered in all respects as only illustrative and not restrictive.

What is claimed is:

1. A memory device, comprising:
    a 3D array of memory cells with one or more blocks, the blocks including:
        a plurality of layers, layers in the plurality including semiconductor strips which extend from a semiconductor pad, the layers being disposed so that the semiconductor strips in the plurality of layers form a plurality of stacks of semiconductor strips and a stack of semiconductor pads;
        a plurality of select gate structures disposed over stacks of semiconductor strips in the plurality of stacks between the semiconductor pad and memory cells on the semiconductor strips, different ones of the plurality of select gate structures coupling the semiconductor strips in different ones of the stacks of semiconductor strips to the semiconductor pads in the plurality of layers; and
        an assist gate structure disposed over the plurality of stacks between the select gate structures and the stack of semiconductor pads.

2. The device of claim 1, wherein the semiconductor pads comprise landing areas for interlayer connectors, and including openings in the stack of semiconductor pads configured to provide vias for connection between the landing areas on the semiconductor pads to overlying conductors.

3. The device of claim 2, including regions in the landing areas having higher doping concentration relative to other regions of the semiconductor pads.

4. The device of claim 1, wherein the semiconductor strips comprise NAND string channels, and including a plurality of word lines overlying plurality of the stacks of semiconductor strips, the word lines including vertical gate structures between the stacks in the plurality of stacks.

5. The device of claim 1, wherein the assist gate structure includes a conductor overlying the plurality of stacks with vertical gate structures between the stacks in the plurality of stacks, and a dielectric charge storage layer is disposed as a gate dielectric layer between the vertical gate structures and the semiconductor strips.

6. The device of claim 1, wherein the assist gate structure includes a conductor overlying the plurality of stacks with vertical gate structures between the stacks in the plurality of stacks, and a gate dielectric layer between the vertical gate structures and the semiconductor strips.

7. The device of claim 1, wherein the assist gate structure is separated from the semiconductor pads on at least one side by a gate dielectric layer, and under bias can induce an inversion channel along a side of the semiconductor pads.

8. The device of claim 1, including at least one assist gate structure disposed over the plurality of stacks between the select gate structures.

9. The device of claim 1, including one or more lateral assist gate structures connected to the select gate structures.

* * * * *